(12) United States Patent
Kwag et al.

(10) Patent No.: US 12,009,452 B2
(45) Date of Patent: Jun. 11, 2024

(54) ELECTRONIC DEVICE INCLUDING LED TRANSMISSION DEVICE, AND CONTROL METHOD THEREFOR

(71) Applicant: SAMSUNG ELECTRONICS CO., LTD., Suwon-si (KR)

(72) Inventors: Doyoung Kwag, Suwon-si (KR); Byungchul Kim, Suwon-si (KR); Minsub Oh, Suwon-si (KR); Sangmoo Park, Suwon-si (KR); Eunhye Kim, Suwon-si (KR); Yoonsuk Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 709 days.

(21) Appl. No.: 17/258,061

(22) PCT Filed: Jul. 23, 2019

(86) PCT No.: PCT/KR2019/009074
§ 371 (c)(1),
(2) Date: Jan. 5, 2021

(87) PCT Pub. No.: WO2020/022740
PCT Pub. Date: Jan. 30, 2020

(65) Prior Publication Data
US 2021/0288209 A1    Sep. 16, 2021

(30) Foreign Application Priority Data

Jul. 23, 2018  (KR) .................. 10-2018-0085177
Jul. 22, 2019  (KR) .................. 10-2019-0088558

(51) Int. Cl.
*H01L 33/00* (2010.01)
*H01L 27/15* (2006.01)

(52) U.S. Cl.
CPC .......... *H01L 33/005* (2013.01); *H01L 27/156* (2013.01)

(58) Field of Classification Search
CPC ......... H01L 21/67259; H01L 21/67712; H01L 21/67721; H01L 21/67144;
(Continued)

(56) References Cited

U.S. PATENT DOCUMENTS 6,961,993 B2    11/2005  Oohata
8,476,826 B2    7/2013   Oohata et al.
(Continued)

FOREIGN PATENT DOCUMENTS

CN    101859714 A    10/2010
CN    103766016 A    4/2014
(Continued)

OTHER PUBLICATIONS

Communication dated Nov. 7, 2022 issued by the European Patent Office in European Patent Application No. 19840826.2.
(Continued)

*Primary Examiner* — Yasser A Abdelaziez
(74) *Attorney, Agent, or Firm* — Sughrue Mion, PLLC

(57) ABSTRACT

An electronic device is disclosed. The electronic device comprises: a transfer device capable of moving, to a target substrate, a plurality of LEDs arranged in a transfer substrate, and arranging same; a storage unit in which feature information of each of the plurality of LEDs is stored; and a processor for controlling the transfer device such that each of a plurality of LEDs is arranged in an arrangement location on the target substrate of each of a plurality of LEDs on the basis of the stored feature information.

17 Claims, 33 Drawing Sheets

(58) Field of Classification Search
CPC ... H01L 21/67271; H01L 24/75; H01L 24/95; H01L 27/156; H01L 33/005; H01L 33/0095; H01L 2224/757; H01L 2224/75725; H01L 2224/75745; H01L 2224/75901; H01L 2224/7598; H01L 2924/12041; H05K 13/0408; H05K 13/085

See application file for complete search history.

(56) References Cited

U.S. PATENT DOCUMENTS

| | | | |
|---|---|---|---|
| 8,646,505 | B2 | 2/2014 | Bibl et al. |
| 9,373,274 | B2 | 6/2016 | Okuyama |
| 9,653,642 | B1 | 5/2017 | Raring et al. |
| 10,510,923 | B2 | 12/2019 | An |
| 10,804,425 | B2 | 10/2020 | Moon et al. |
| 10,854,775 | B2 | 12/2020 | Schlemper et al. |
| 2010/0259164 | A1* | 10/2010 | Oohata ............... H01L 25/0753 445/24 |
| 2011/0275171 | A1 | 11/2011 | Chen |
| 2011/0302776 | A1* | 12/2011 | Kato .................. H05K 13/085 29/829 |
| 2014/0120640 | A1 | 5/2014 | Shieh et al. |
| 2017/0358478 | A1 | 12/2017 | Thothadri et al. |
| 2018/0006083 | A1 | 1/2018 | Zhu et al. |
| 2018/0337215 | A1* | 11/2018 | Afshar ................. G02B 6/0078 |
| 2019/0115233 | A1* | 4/2019 | Chen ..................... H01L 25/167 |
| 2019/0159316 | A1* | 5/2019 | Pfeffer .................. H05B 47/11 |
| 2019/0334056 | A1 | 10/2019 | Schlemper et al. |
| 2021/0013184 | A1* | 1/2021 | Kwon ................. H01L 25/0753 |

FOREIGN PATENT DOCUMENTS

| | | |
|---|---|---|
| CN | 104041205 A | 9/2014 |
| CN | 104041206 A | 9/2014 |
| DE | 10 2016 221 533 A1 | 5/2018 |
| JP | 2006-41283 A | 2/2006 |
| JP | 2007-329266 A | 12/2007 |
| JP | 2010-161221 A | 7/2010 |
| JP | 2010-206157 A | 9/2010 |
| JP | 2012-89572 A | 5/2012 |
| JP | 4979989 B2 | 7/2012 |
| JP | 2013-26537 A | 2/2013 |
| JP | 5135865 B2 | 2/2013 |
| JP | 5740901 B2 | 7/2015 |
| JP | 5789681 B2 | 10/2015 |
| KR | 10-2013-0064010 A | 6/2013 |
| KR | 10-2014-0109890 A | 9/2014 |
| KR | 10-2016-0006790 A | 1/2016 |
| KR | 10-2018-0035430 A | 4/2018 |
| KR | 10-1900925 B1 | 9/2018 |
| KR | 10-1956231 B1 | 3/2019 |
| SG | 191486 A1 | 7/2013 |
| WO | 2013/074373 A1 | 5/2013 |
| WO | WO 2013/108368 * | 7/2013 |

OTHER PUBLICATIONS

Communication dated Apr. 20, 2021 issued by the European Patent Office in European Application No. 19840826.2.

Communication dated Jun. 9, 2023 by National Intellectual Property Administration of P.R. China in Chinese Application No. 201980049376.2.

International Search Report (PCT/ISA/210) dated Nov. 19, 2019 by the International Searching Authority in counterpart International Patent Application No. PCT/KR2019/009074.

Written Opinion (PCT/ISA/237) dated Nov. 19, 2019 by the International Searching Authority in counterpart International Patent Application No. PCT/KR2019/009074.

* cited by examiner

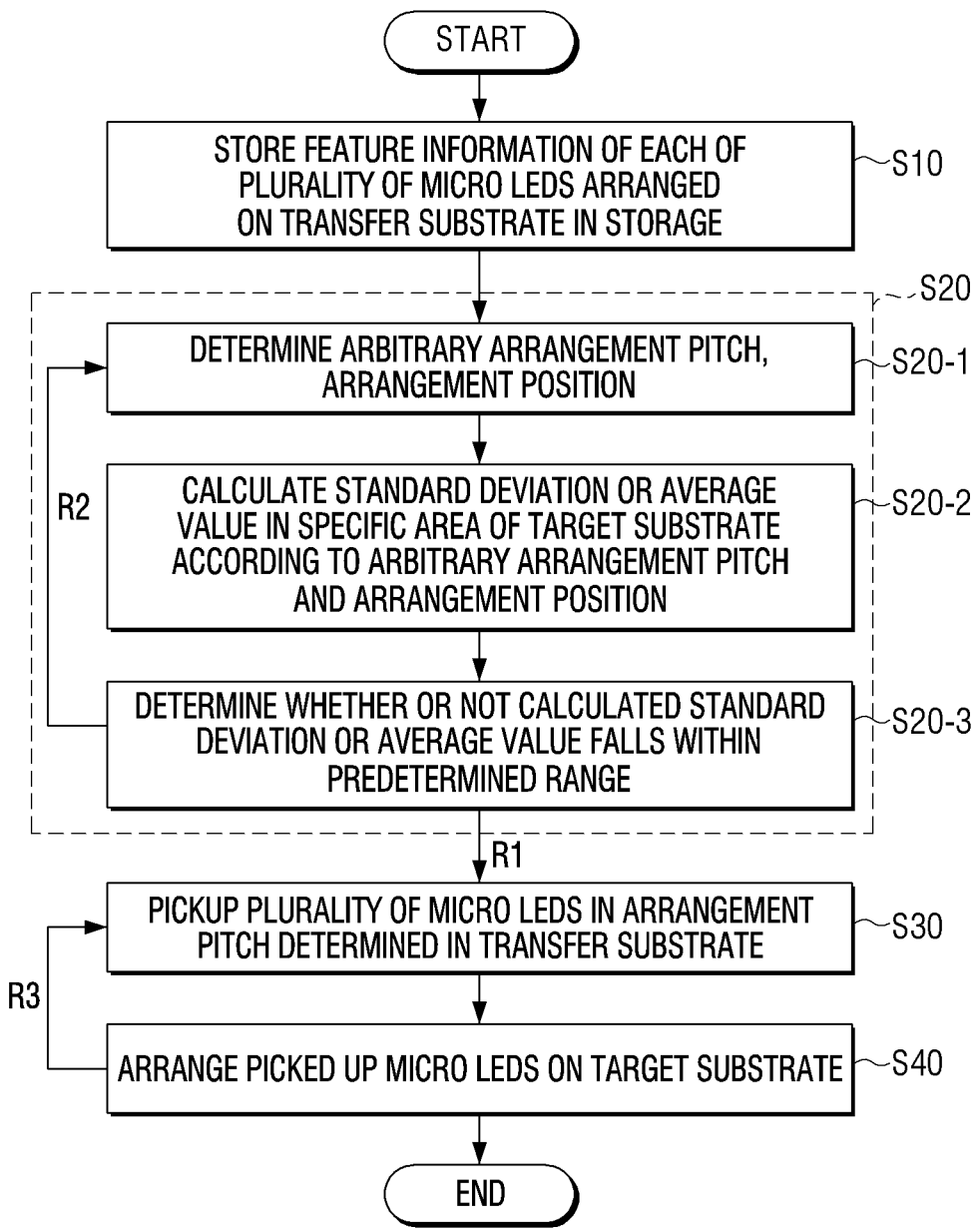

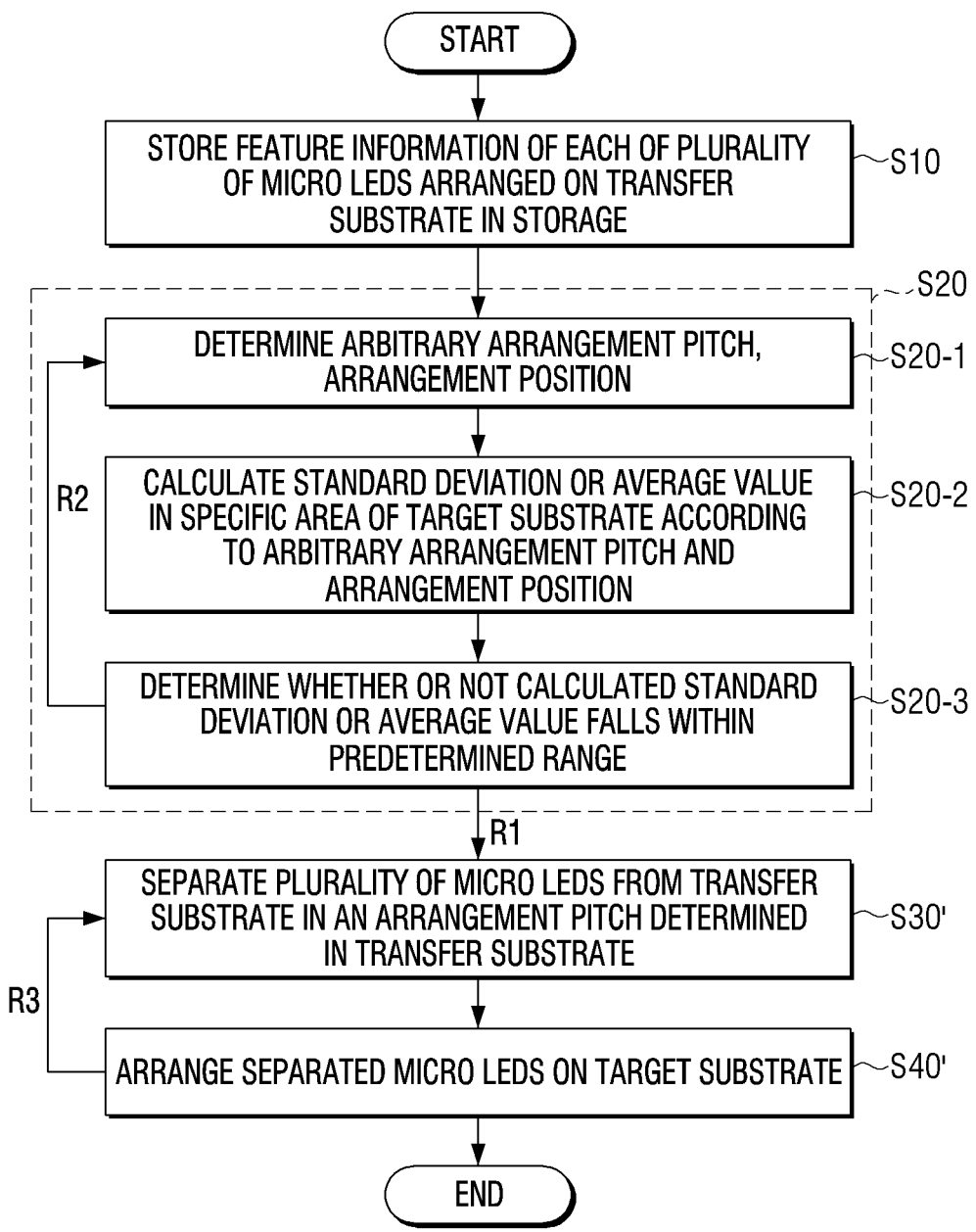

ELECTRONIC DEVICE INCLUDING LED TRANSMISSION DEVICE, AND CONTROL METHOD THEREFOR

TECHNICAL FIELD

The disclosure relates to an LED electronic device which implements a rearrangement of the LED manufactured by the semiconductor process on a sapphire substrate or a wafer at the time of transferring to a substrate of a display module and a control method therefor.

BACKGROUND ART

Semiconductor light emitting diodes (LED) have been widely used as not just light sources for lighting devices, but also light sources for various display apparatuses of various electronic products such as, for example, and without limitation, a television (TV), a mobile phone, a personal computer (PC), a notebook PC, a personal digital assistant (PDA), or the like.

In particular, recently, micro LEDS with a short edge of 100 μm or less are being developed, and the micro LEDs have a faster response rate, a lower power consumption, and a higher brightness compared to conventional LEDs, and is spotlighted as the light emitting element of the next generation displays for being able to display an image in high resolution such as 4K and 8K despite being in a small inch.

The LEDs may be manufactured in a semiconductor chip form on a wafer, and by being arranged on a target substrate, the LEDs may configure a light emitting module of a display.

DISCLOSURE

Technical Problem

However, based on the semiconductor LED on the wafer being manufactured in a state in which the performance of color, brightness and the like is different from one another due to a manufacturing tolerance in the manufacturing process, differences in performance between each area of the semiconductor LED on the wafer may occur.

Accordingly, by arranging the semiconductor LEDs on the wafer to a target substrate in an exact arrangement state in which the area performance between the semiconductor LEDs on the wafer is different, the performance between each area of the semiconductor LED on the target substrate may also be varied.

The difference in performance between each area of the semiconductor LEDs on the target substrate also includes the problem of the brightness or color of the manufactured display not being uniform.

Technical Solution

The disclosure provides an electronic device including an LED transfer device which causes uniformity of performance or feature between the plurality of LEDs arranged on the target substrate to be improved and a control method therefor.

According to an embodiment, an electronic device including a transfer device capable of moving a plurality of LEDs arranged on a transfer substrate to a target substrate and arranging the plurality of LEDs, a storage stored with feature information of each of the plurality of LEDs, and a processor configured to control the transfer device to arrange each of the plurality of LEDs to an arrangement position on the target substrate of each of the plurality of LEDs determined based on the stored feature information may be provided.

The processor may be configured to divide the transfer substrate and the target substrate into a plurality of areas, and determine an arrangement position of each of the plurality of LEDs to cause an output feature between a plurality of areas comprising the target substrate to be uniform and cause LEDs within different areas from one another of the transfer substrate to be arranged in one area of the target substrate.

The processor may be configured to control the transfer device to cause the LEDs within different areas from one another of the transfer substrate to be alternately arranged in the one area of the target substrate.

The processor may be configured to control the transfer device to cause the plurality of LEDs mutually spaced apart from among the plurality of LEDs arranged on the transfer substrate to be simultaneously picked up.

The transfer device may be configured to simultaneously pick up a plurality of LEDs on the transfer substrate and arrange on the target substrate, and the processor may be configured to determine a pitch of the plurality of LEDs to be simultaneously picked up, and control the transfer device to cause the plurality of LEDs to be simultaneously picked up based on the determined pitch.

The processor may be configured to determine an arrangement position on the target substrate of each of the plurality of LEDs taking into consideration an output feature between a plurality of areas and a moving distance of a transfer device of the target substrate.

The processor may be configured to determine a moving order of each of the plurality of LEDs, and control the transfer device to cause each of the plurality of LEDs to be arranged based on an arrangement position and moving order of the determined each of the plurality of LEDs.

The LED may be of a size in which a short edge is 100 μm or less, and the feature information of the LED may be at least one from among an output wavelength, the brightness, and the performance grade of the LED.

According to an embodiment, a method of arranging LEDs which includes dividing a transfer substrate arranged with a plurality of LEDs into a plurality of areas, determining, based on feature information of each of the plurality of LEDs, an arrangement position of each of the plurality of LEDs to cause an output feature between a plurality of areas comprising a target substrate to be uniform and cause the LEDs within different areas from one another of the transfer substrate to be arranged in one area of the target substrate, and arranging the each of the plurality of LEDs to an arrangement position on the determined target substrate is provided.

The arranging includes controlling the LEDs within areas different from one another of the transfer substrate to be alternatively arranged at one area of the target substrate The arranging includes simultaneously picking up the plurality of LEDs mutually spaced apart on the transfer substrate and arranging on the target substrate.

The determining includes determining a pitch of a plurality of LEDs to be simultaneously picked up, and the arranging includes simultaneously picking up the plurality of LEDs based on the determined pitch.

The determining includes determining an arrangement position on the target substrate with respect to the plurality of LEDs of each of the plurality of transfer substrates based on feature information of the stored each of the plurality of transfer substrates.

The determining includes determining an arrangement position on the target substrate considering an output feature between a plurality of areas and a moving distance of a transfer device of the target substrate.

The determining a moving order of each of the plurality of LEDs may be further included, and the arranging may include arranging each of the plurality of LEDs based on an arrangement position and moving order of the determined each of the plurality of LEDs.

The LED may be of a size in which a short edge is 100 μm or less, and the feature information of the LED may be at least one from among the output wavelength, the brightness, and the performance grade of the LED.

The arranging includes transferring the plurality of LEDs of the target substrate to a first plurality of columns at a second pitch in a first direction on the target substrate, transferring, in-between the plurality of LEDs transferred to the first plurality of columns, the plurality of LEDs of the transfer substrate to a second plurality of columns different from the first plurality of columns in the first direction on the target substrate, and transferring the plurality of LEDs of the transfer substrate to a second direction perpendicular with the first direction on the target substrate.

The method further includes rotating, after transferring to the second plurality of columns, at least one from among the transfer substrate and the target substrate.

The transferring to the second plurality of columns includes transferring the plurality of LEDs at a second pitch, and the transferring to the second direction includes transferring the plurality of LEDs of the transfer substrate in-between the plurality of LEDs transferred to the first direction.

The arranging includes transferring the plurality of LEDs arranged at a second pitch within a first transfer area from among the plurality of LEDs of the transfer substrate to the first transfer area on the target substrate and transferring the plurality of LEDs arranged at the second pitch within a second transfer area different from the first transfer area from among the plurality of LEDs of the transfer substrate to the second transfer area on the target substrate, and the transferring to the second transfer area includes transferring the plurality of LEDs within the second transfer area in-between the plurality of LEDs within the first transfer area.

The transferring to the first transfer area includes repeatedly transferring on the target substrate, and the transferring to the second transfer area includes repeatedly transferring on the target substrate.

The transferring to the first transfer area and the transferring to the second transfer area may be transferred with a pick and place method.

The transferring to the first transfer area may include transferring the plurality of LEDs arranged within a first area of the transfer substrate, and the transferring to the second transfer area may include transferring the plurality of LEDs arranged within a second area different from the first area of the transfer substrate.

Further, according to an embodiment, a computer readable recording medium including a program for executing an LED arrangement method, which includes dividing a transfer substrate arranged with a plurality of LEDs into a plurality of areas, determining, based on feature information of each of the plurality of LEDs, an arrangement position of each of the plurality of LEDS to cause an output feature between the plurality of areas comprising a target substrate to be uniform and cause LEDs within areas different from one another of the transfer substrate to be arranged at one area of the target substrate, and outputting arrangement position information on the target substrate with respect to each of the plurality of LEDs, is provided.

DESCRIPTION OF DRAWINGS

FIG. 9A is a flowchart illustrating a control method of an electronic device according to an embodiment of the disclosure;

FIG. 9B is a flowchart illustrating a control method of an electronic device according to another embodiment of the disclosure;

DETAILED DESCRIPTION OF EXEMPLARY EMBODIMENTS

Example embodiments of the disclosure will be described with reference to the accompanying drawings to assist in the sufficient understanding of the configuration and effect of the disclosure. However, the disclosure is not limited to the embodiments described below, and may be implemented to various forms and various modifications may be made. The description of the embodiments are provided to complete the disclosure, and to assist those of ordinary skill in the related art to comprehend the scope of the disclosure. For convenience of description, the elements in the accompanying drawings have been illustrated exaggerated than the actual size, and the ratio of each element may be exaggerated or downscaled.

When a certain element is indicated as being "on" or "connected" to another element, it should be understood that the element may be in direct contact on or connected to another element, but also that another element may be present therebetween. On the other hand, when a certain element is disclosed as being "directly on" or "directly connecting to" another element, it should be understood has there being no other element present therebetween. Other expressions describing the relationship between the elements, for example, and without limitation " . . . between . . . ," " . . . directly between . . . ," or the like is to be construed in the same manner.

The terms such as "first," "second," and the like may be used to describe a variety of elements, but the elements should not be limited by these terms. The terms are used only for the purpose of distinguishing one element from another. For example, without exceeding the scope of the disclosure, a first element may be designated as a second element, and likewise a second element may be designated as a first element.

A singular expression includes a plural expression, unless otherwise specified. Terms such as "comprise" or "include" are used herein to designate a presence of a characteristic, number, step, operation, element, component, or a combination thereof, and should be construed as one or more of other characteristics, numbers, steps, operations, elements, components or a combination thereof may be further added.

In addition, the term uniform or uniformity described throughout the disclosure may refer to including all number of cases included within a certain range based on a value same as a reference value or the reference value.

Unless otherwise specified, the terms used in the embodiments of the disclosure may be interpreted to a meaning commonly known to those of ordinary skill in the related art.

Figure 1A:
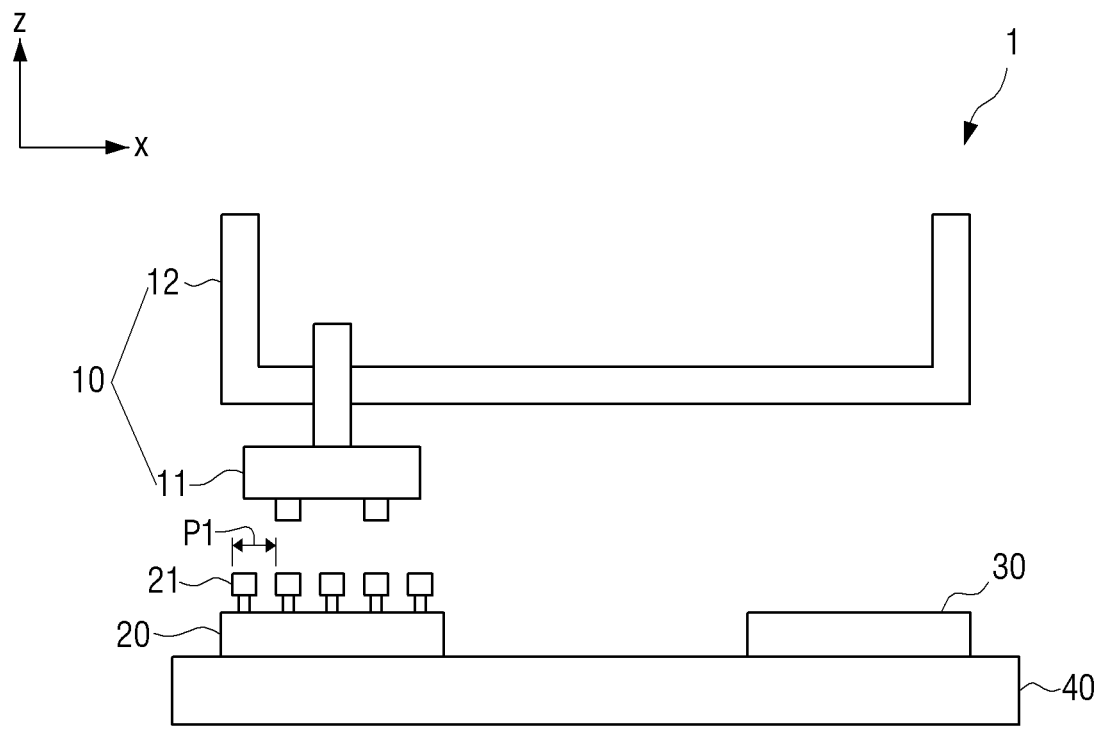
FIG. 1A is a schematic diagram illustrating an electronic device according to an embodiment of the disclosure.
Figure 1B:
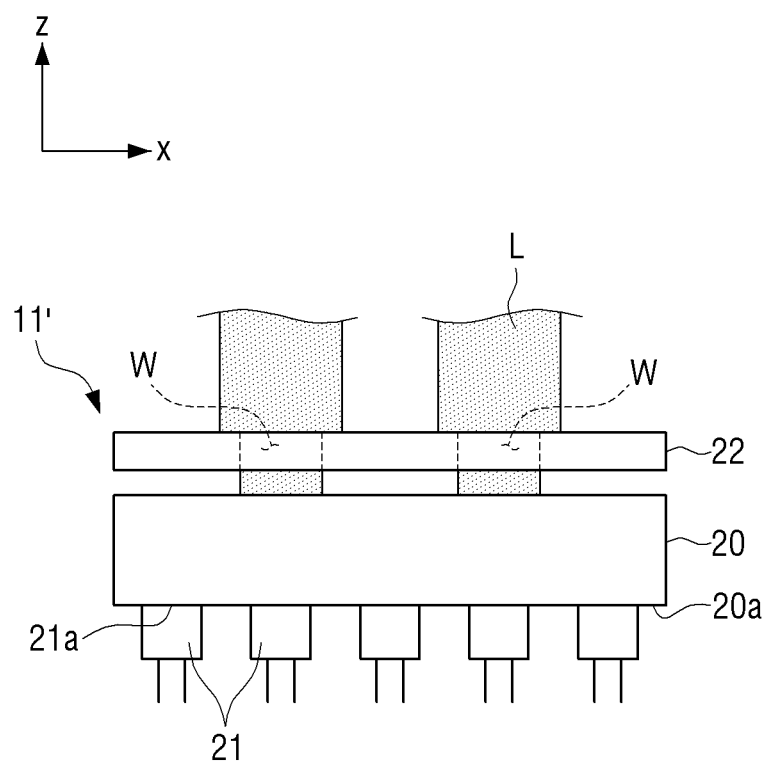
FIG. 1B is a schematic diagram illustrating a pickup device according to another embodiment of the disclosure.
Figure 2:
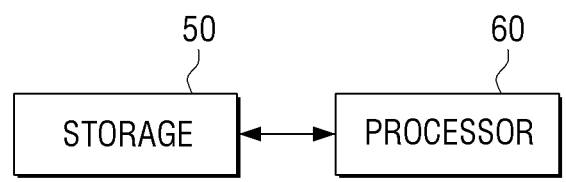
FIG. 2 is a block diagram illustrating a storage and a processor.

FIG. 1A is a schematic diagram illustrating an electronic device 1 according to an embodiment of the disclosure, FIG. 1B is a schematic diagram illustrating a pickup device 11' according to another embodiment of the disclosure, and FIG. 2 is a block diagram illustrating a storage 50 and a processor 60.

The configuration and structure of the electronic device 1 and 1' will be described in detail with reference to FIGS. 1A to 2 below.

As illustrated in FIG. 1A, the electronic device 1 may include a transfer device 10 which is capable of arranging a plurality of micro LEDs 21 arranged on a transfer substrate 20 by moving to a target substrate 30, a storage 50 stored with feature information of each of the plurality of micro LEDs 21, and a processor 60 configured to determine an arrangement position on the target substrate 30 of each of the plurality of micro LEDs 21 based on stored feature information, and control the transfer device 10 to arrange each of the plurality of micro LEDs 21 to an arrangement position.

The transfer device 10 may include a pickup device 11 which picks up the plurality of micro LEDs arranged on the transfer substrate 20 and a movement device 12 which is connected to the pickup device 11 and moves the pickup device 11 to the transfer substrate 20 or the target substrate 30.

The transfer substrate 20 may refer to the substrate to which the plurality of micro LEDs 21 are arranged which is finally transferred to the target substrate 30 that is used in a product. For example, the transfer substrate 20 may be designated as a sapphire substrate, a carrier substrate, a wafer, or the like.

Further, the transfer device 10 may not only move up, down, left and left along the spatial coordinate system (X-, Y-, Z-axis) on the transfer substrate 20 and the target substrate 30, but also rotate about the X-, Y-, Z-axis.

Figure 3:
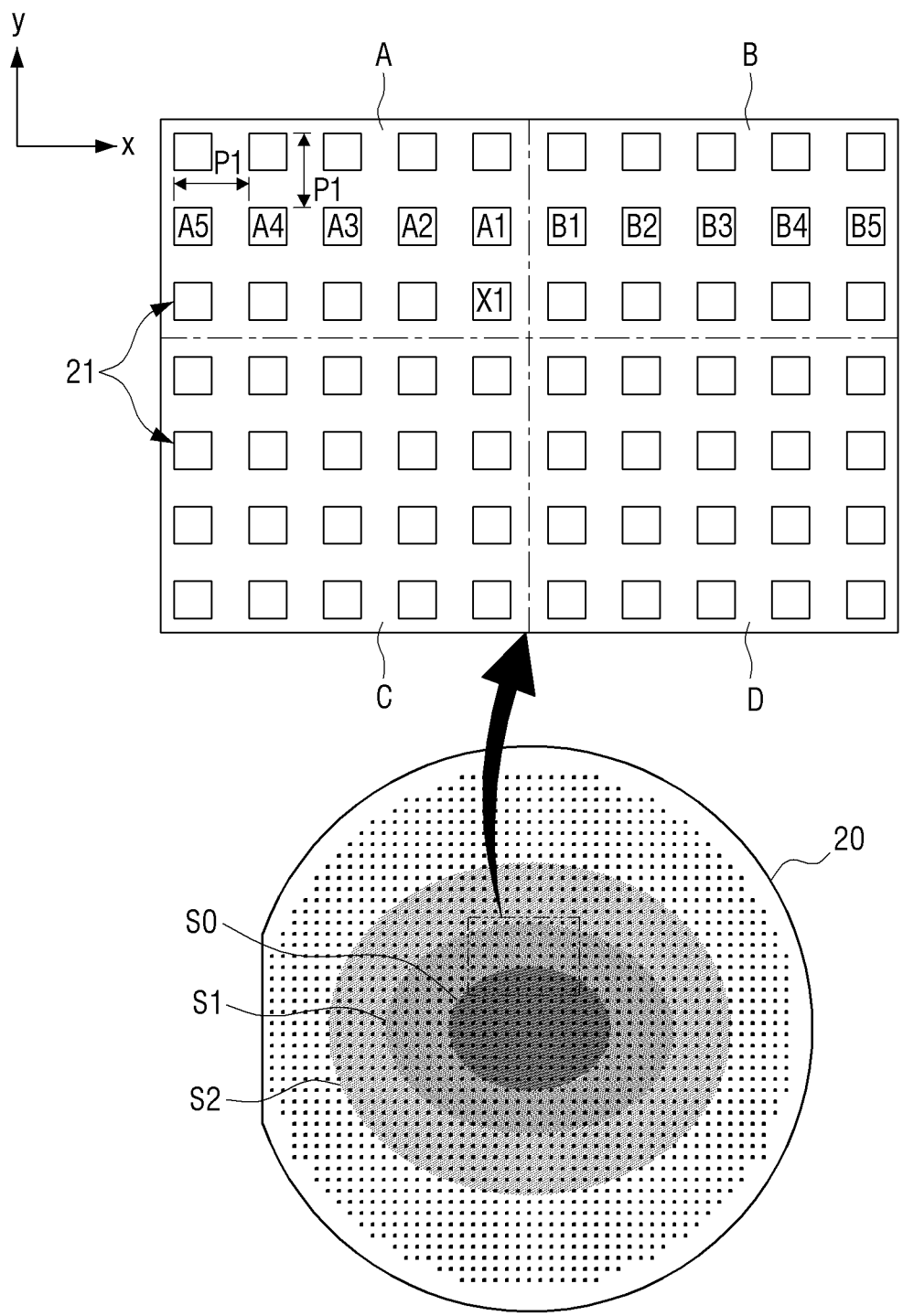
FIG. 3 is a top view of a transfer substrate in which feature information of a plurality of micro LEDs is input.

For example, referring to FIG. 3, the transfer device 10 may be moved from a position of picking up an A1micro LED to a position in which an X1micro LED which is arranged spaced apart in a Y-axis direction of the A1micro LED is arranged.

Accordingly, the transfer device 10 may, after picking up the plurality of micro LEDs 21 from the transfer substrate 20, mount the picked up plurality of micro LEDs 21 to various positions of the target substrate 30.

The pickup device 11 may selectively or collectively pick up the plurality of micro LEDs arranged on the transfer substrate 20, and pick up the micro LED 21 through various methods such as, for example, and without limitation, an adhesive method, a vacuum method, an electrostatic method, a hybrid method, or the like based on necessity.

Accordingly, if the pickup device 11 may be able to pick up the plurality of micro LEDs 21 while simultaneously being connected to the movement device 12, the pickup device 11 may be formed to a variety of structures.

The pickup device 11 may mount the picked up plurality of micro LEDs 21 by rearranging onto the target substrate 30. The method in which the pickup device 11 and 11' mounts the picked up plurality of micro LEDs 21 on the target substrate 30 may include a pick and place method or a laser lift-off method.

The pickup device 11 which is illustrated in FIG. 1A may refer to a device which transfers the plurality of micro LEDs 21 of the transfer substrate 20 on the target substrate 30 using a pick and place method.

Further, the pickup device 11' which is illustrated in FIG. 1B may refer to a device which transfers the plurality of micro LEDs 21 of the transfer substrate 2 on the target substrate 30 using a laser lift-off method.

The transfer substrate 20 may be in contact with a top surface 21a of the plurality of micro LEDs 21, and fix the plurality of micro LEDs 21 to the transfer substrate 20. That is, the plurality of micro LEDs 21 may be attached to a bottom surface 20a of the transfer substrate 20.

Then, a mask plate 22 is disposed on a top surface of the transfer substrate 20 which is formed with a through hole W at a predetermined distance or in a pattern, and a laser irradiated through the through hole W may separate the micro LED 21 placed at a position corresponding to the through hole W and arrange the separated micro LED 21 on the target substrate 30.

Accordingly, the method in which the plurality of micro LEDs 21 arranged on the transfer substrate 20 is rearranged and mounted to the target substrate 30 may be applied to both of the pick and place method or the laser lift-off/laser ablation method.

The movement device 12 may be a structure supporting the pickup device 11 to transfer to the pickup device 11, and may be coupled to a structure which is not shown. The movement device 12 may move the pickup device 11 through a common structure such as, for example, and without limitation, a multiple joint structure, a piston structure, a sliding structure, or the like.

Further, the movement device 12 itself may move while the movement device 12 is in a connected state with the pickup device 11.

The plurality of micro LEDs 21 may be disposed on the transfer substrate 20. Specifically, as illustrated in FIG. 1A, when the plurality of micro LEDs 21 is transferred on the target substrate 30 using the pick and place method, the plurality of micro LEDs 21 may be arranged on a top surface of the transfer substrate 20.

Based on the plurality of micro LEDs 21 being transferred on the target substrate 30 with the laser lift-off method, the plurality of micro LEDs 21 may be arranged at the bottom surface of the transfer substrate 20.

That is, according to the transfer method of the plurality of micro LEDs 21 on the target substrate 30, the arrangement position of the plurality of micro LEDs 21 on the transfer substrate 20 may be varied.

In addition, the plurality of micro LEDs 21 may be arranged mutually in a first pitch P1 on an XY plane. The first pitch P1 may refer to a distance between a one surface of a micro LED and a one surface of an adjacent anther micro LED.

The micro LED 21 may be a size in which the short edge is 100 μm. The micro LED 21 of the disclosure may be configured such that the width, length, and height are 10 μm-100 μm, respectively, and preferable less than or equal to 30 μm.

The target substrate 30 may be a configuration to which the plurality of micro LEDs 21 are arranged and is physically and electrically connected with the plurality of micro LEDs 21. The target substrate 30 may be designated as a display module substrate, a thin film transistor (TFT) substrate, a thin film transistor (TFT) glass substrate, a backplane, or the like, and may be in various forms to be applied to a display product.

The stage 40 may be a configuration to which the transfer substrate 20 and the target substrate 30 are loaded and unloaded, respectively, and may be formed as a plate. The stage 40 may move relatively to the transfer device 10 while in a loaded state with the transfer substrate 20 and the target substrate 30.

The storage 50 may be included in the electronic device 1, and configured as a memory. Specifically, the storage 50 may be implemented as at least one from among a flash memory type, a read only memory (ROM), a random access memory (RAM), a hard disk type, a multimedia card micro type, or a card type memory (e.g., SD or XD memory, etc.).

Further, the storage 50 may be electrically connected with the processor 60 and may mutually transmit a signal and information with the processor 60. Accordingly, the storage 50 may store input or irradiated feature information of the plurality of micro LEDs 21 and transmit the stored feature information to the processor 60.

The processor 60 may be embedded within the electronic device 1, and control the overall operation of the electronic device 1. Further, the processor 60 may perform the function of controlling the overall operation of the electronic device 1.

The processor 60 may include one or more from among a central processing unit (CPU), a controller, an application processor (AP), a communication processor (CP), or an ARM processor.

Further, the processor may be electrically connected with the storage 50, and use the feature information of the plurality of micro LEDs 21 stored in the storage 50. The specific function of the processor 60 according to an embodiment of the disclosure will be described below.

Figure 4A:
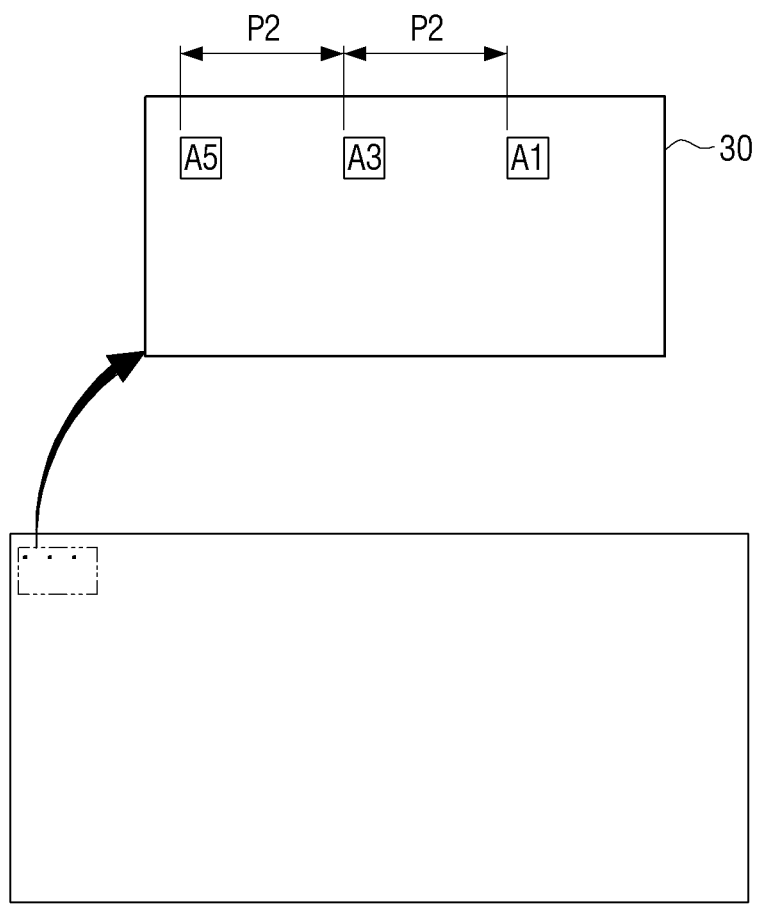
FIG. 4A is a top view illustrating a target substrate in a first state to which a plurality of micro LEDs are mounted.

FIG. 3 is a top view illustrating a transfer substrate 20 to which feature information of a plurality of micro LEDs 21 is input, FIG. 4A is a top view illustrating a target substrate 30 in a first state to which a plurality of micro LEDs 21 is mounted, and 4B is a top view illustrating a target substrate 30 in a second state to which a plurality of micro LEDs 21 are mounted. The arrangement process of the micro LED of the electronic device 1 will be described below with reference to FIGS. 3 to 5B.

As illustrated in FIG. 3, the plurality of micro LEDs 21 may be arranged at a first pitch P1 on the transfer substrate 20. However, the number of the plurality of micro LEDs 21 arranged on the transfer substrate 20 has been illustrated for convenience of description, and is not limited to the number and size formed in FIG. 3.

The plurality of micro LEDs 21 may be configured such that the feature of a specific area on the transfer substrate 20 may be advantageous due to a manufacturing tolerance in the manufacturing process.

For example, the feature of the plurality of micro LEDs 21 arranged within a first feature area S0 on the transfer substrate 20 may be more advantageous than the feature of the plurality of micro LEDs 21 arranged in an area other than the first feature area (S0).

That is, as illustrated in FIG. 3, and as displayed in the first to third feature areas S0, S1 and S2, the feature of the plurality of micro LEDs 21 on the transfer substrate may be different from one another due to the manufacturing tolerance of the plurality of micro LEDs 21.

The feature of the plurality of micro LEDs 21 may be one from among an output wavelength, brightness, or performance grade.

The output wavelength may be related to a color emitted and exhibited by the micro LED 21, and the color exhibited by the micro LED 21 may vary according to the output wavelength.

For example, a red color may be exhibited if the micro LED 21 emits light of a wavelength band of approximately 630 nm to 780 nm, a green color may be exhibited if light is emitted at a wavelength band of approximately 520 nm to 570 nm, and a blue color may be exhibited if light is emitted at a wavelength band of approximately 420 nm to 480 nm.

More specifically, even if a micro LED exhibiting a green color light of a wavelength band of approximately 520 nm to 570 nm is arranged on the transfer substrate 20, the wavelength band which is closest to approximately 520 nm may exhibit a bluish green color, and a wavelength band which is closest to approximately 570 nm may exhibit an yellowish green color.

Accordingly, the feature of the micro LED 21 may also vary according to the output wavelength emitted by the micro LED 21.

In addition, the brightness may represent a brightness of a light source having a certain range, and the brightness exhibited by the plurality of micro LEDs 21 may vary according to the brightness of the plurality of micro LEDs 21 arranged on the transfer substrate 20.

Further, the performance grade refers to classifying the output wavelength or the brightness according to a specific standard, and the specific standard may various according to a need of a user.

For example, based on the performance grade being based on the output wavelength, a high performance grade may be set the closer it is to the wavelength band of a specific standard, and a low performance grade may be set the farther it is from the wavelength band of a specific standard.

In addition, based on the performance grade being based on the brightness, a high performance grade may be set the higher the brightness contained, and a low performance grade may be set the lower the brightness contained.

Further, the performance grade may be based considering both the output wavelength and the brightness according to an arbitrary standard of the user. For example, the performance grade may be set with an emphasis of U/100 to the output wavelength and an emphasis of (100−U)/100 to the brightness according to the feature the user desires to implement in the micro LED 21.

The feature of the plurality of micro LEDs 21 may be measured by using an external measurement device (not shown) with respect to the plurality of micro LEDs 21 arranged on the transfer substrate 20. Further, feature information including the feature on the measured each of the plurality of micro LEDs 21 may be stored in the storage 50.

Alternatively, the feature information which is to be stored in the storage 50 may be input through a separate input device (not shown).

The feature information may be at least one from among a measurement value on the output wavelength or the brightness with respect to each of the plurality of micro LEDs 21, the input output wavelength, the brightness, or the performance grade.

The processor 60 may use the feature information stored in the storage 50, and determine the performance grade on each of the plurality of micro LEDs 21 arranged on the transfer substrate 20.

In addition, the processor 60 may, based on the feature information stored in the storage 50 and the determined performance grade, divide the transfer substrate 20 into a plurality of areas (A, B, C, D).

For example, a micro LED with a 1st grade performance within an A area of the transfer substrate 20 may be referred to as a A1micro LED, and a micro LED with a 5th grade performance within the A area may be referred to as a A5micro LED.

Likewise, a micro LED with a 1st grade performance with a B area of the transfer substrate 20 may be referred to as a B1micro LED, and a micro LED with a 5th grade performance within the B area may be referred to as a B5micro LED.

Further, the processor 60 may divide the target substrate 30 into a plurality of areas Q3 to Q5 and determine an arrangement position of each of the plurality of micro LEDs 21 to cause the output features between the plurality of areas Q3 to Q5 comprising the target substrate 30 to be uniform and the micro LEDs within different areas A, B, C and D from one another of the transfer substrate 20 to be arranged at the one area Q3 to Q5 of the target substrate 30.

The arrangement position may refer to the position which the plurality of micro LEDs 21 are arranged on the target substrate 30, which in turn refers to an arrangement which the plurality of micro LEDs 21 are rearranged.

In addition, the processor 60 may determine the arrangement position of each of the plurality of micro LEDs 21 on the target substrate 30 to cause the output feature between the plurality of areas comprising the target substrate 30 to be uniform based on the stored feature information.

The output feature may correspond to any one from among the output wavelength, the brightness, or the performance grade comprising the feature information.

Further, if the mounting method of the plurality of micro LEDs 21 is a pick and place method, the processor 60 may determine the arrangement pitch P2 between the plurality of micro LEDs 21 to be simultaneously picked up, and control so that the plurality of micro LEDs 21 are simultaneously picked up based on the determined arrangement pitch P2.

That is, the transfer device 10 may simultaneously pick up the plurality of micro LEDs 21 on the transfer substrate 20 and arrange on target substrate 30.

In addition, if the mounting method of the plurality of micro LEDs 21 is a laser lift-off method, by disposing a mask plate 22 which includes a through hole W formed at a predetermined arrangement pitch P2 on the transfer substrate 20 to which the plurality of micro LEDs 21 is fixedly arranged and irradiating a laser, the plurality of micro LEDs 21 may be separated from the transfer substrate 20 and the plurality of micro LEDs 21 may be simultaneously arranged on the target substrate 30.

The arrangement pitch P2 may be greater than the first pitch P1, which is the distance between the plurality of micro LEDs 21 arranged on the transfer substrate 20, and may be an integer multiple of the first pitch P1.

Specifically, the processor 60 may, based on the feature information stored in the storage 50 of A1 to A5 micro LEDs of the A area and the B1 to B5 micro LEDs of the B area, determine the arrangement pitch P2 so that the average value of the output feature or the performance grade between the specific areas Q1 to Q3 on the target substrate 30 is uniform.

Figure 4B:
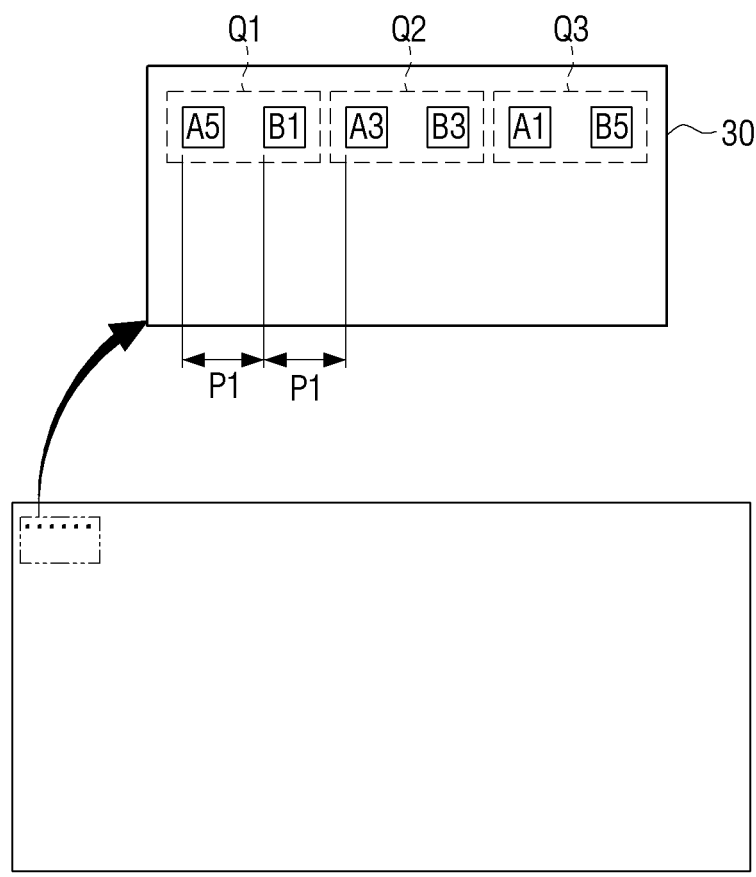
FIG. 4B is a top view illustrating a target substrate in a second state to which a plurality of micro LEDs are mounted.

For example, referring to FIG. 4B, the average value of the performance grade of the A5micro LED and the B1micro LED included in a first area Q1 of the target substrate 30 may be 3, the average value of the performance grade of the A3micro LED and the B3micro LED included in a second area Q2 may be 3, and the average value of the performance grade of the A1micro LED and the B5micro LED included in a third area Q3 may be 3.

Accordingly, in order to implement a standard deviation and an average value such as the micro LEDs to be mounted on the target substrate as in FIG. 4b, the transfer device 10 may simultaneously pick up the plurality of micro LEDs 21 in a plurality of areas A, B, C and D of the transfer substrate 20 at an arrangement pitch P2 which is twice as much as the first pitch P1.

In addition, the processor 60 may determine the arrangement pitch P2 so that the standard deviation of the output feature or the performance grade between specific areas Q1 to Q3 on the target substrate 30 falls within a predetermined range.

For example, the processor 60 may, based on the feature information of the plurality of micro LEDs 21 arranged on the transfer substrate 20, execute a simulation on the arrangement on the target substrate 30 according to the arrangement pitch P2.

If the standard deviation on the performance grade of the plurality of micro LEDs included in a specific areas Q1 to Q3 of the target substrate 30 is calculated, and based on the standard deviation falling within a predetermined range, the micro LED may be picked up at an arrangement position and arrangement pitch P2 determined in the processor 60 and arranged on the target substrate 30.

Further, based on the calculated standard deviation exceeding the predetermined range, the processor 60 may calculate a new standard deviation based on a new arrangement position and an arrangement pitch P2.

The specific areas Q1 to Q3 may be an arbitrary area and may be of various shape, range or extent based on a selection by the user.

In addition, the average value and standard deviation between the specific areas Q1 to Q3 have been described as one example for determining the plurality of micro LEDs 21 to be mounted on the target substrate 30 as having a distribution of uniform performance grade.

Accordingly, in order to determine whether the plurality of micro LEDs 21 have a distribution of uniform performance grade, a measurement calculation method of various distributions which may be used in not only for the average value of a specific area Q1 to Q3, and standard deviation, but also in statistics such as dispersion and spread.

Further, the measurement calculation method may not be limited to analyzing the performance grade of all micro LEDs 21 included in the specific area, but also determine the distribution of each performance grade by calculating a sampling of the plurality of micro LEDs included in the specific area.

Specifically, taking into consideration a degree of overload by the processor 60, the calculation time, and the like, the distribution may be determined based on necessity through various samplings of, for example, an average of a maximum value and a minimum value, an intermediate value, or the like from among the performance grade of the micro LEDs included in a specific area.

In addition, the processor 60 may determine the arrangement position on the target substrate 30 of each of the plurality of micro LEDs 21 taking in consideration the output feature between the plurality of areas of the target substrate 30 and the moving distance of the transfer device 10.

The bigger the arrangement pitch P2 of picking up the plurality of micro LEDs 21, the farther the moving distance of the transfer device 10 transferring the picked up plurality of micro LEDs 21.

For example, based on the arrangement pitch P2 of the plurality of micro LEDs 21 to be picked up being fourfold of the first pitch P1, because the transfer device 10 moves twofold further than the when the arrangement pitch P2 is twofold of the first pitch P1, the moving distance may increase. Accordingly, based on the moving distance increasing, the moving speed and production speed of arranging the plurality of micro LEDs 21 arranged on the transfer substrate 20 on the target substrate 30 may be decreased.

Accordingly, the processor 60 may determine the arrangement position on the target substrate 30 of each of the plurality of micro LEDs 21 taking into consideration the output feature between the plurality of areas of the target substrate and the moving distance of the transfer device 10.

Referring back to FIG. 3, the processor 60 may determine whether to pick up in an arrangement pitch P2 of twofold of the first pitch P1 or separate from the transfer substrate 20 with respect to the plurality micro LEDs 21 included within the plurality of areas A, B, C and D on the transfer substrate 20.

Then, the processor 60 may control the transfer device 10 to simultaneously pick up the A5micro LED, the A3micro LED, and the A1micro LED arranged in the arrangement pitch P2 from among the micro LEDs included in the A area of the transfer substrate 20 or simultaneously separate from the transfer substrate 20.

Then, the processor 60 may, after controlling the transfer device 10 to move onto the target substrate 30, control to cause transfer device 10 to be picked up at the arrangement pitch P2 or the A5micro LED, A3micro LED, and the A1micro LED separated from the transfer substrate 20 to be mounted on the target substrate 30 at the arrangement pitch P2.

Then, the processor 60 may control the transfer device 10 to cause the micro LEDS within different areas from one another of the transfer substrate 20 to be alternately arranged in one area of the target substrate 30.

The processor 60 may, after picking up the A5micro LED, the A3micro LED, and the A1micro LED included in the A area of the transfer substrate 20, control to simultaneously pick up a B1micro LED, a B3micro LED, and a B5micro LED included in a B area which is different from the A area of the transfer substrate 20 or simultaneously separate from the transfer substrate 20.

The order in which pick up of the A area and the B area or separating from the transfer substrate 20 may be varied.

As illustrated in FIG. 4B, the processor 60 may, after controlling the transfer device 10 to move onto the target substrate 30, control to cause the transfer device 10 to be picked up at an arrangement pitch P2 or cause the B1micro LED, the B3micro LED, and the B5micro LED separated from the transfer substrate 20 to be mounted on the target substrate 30 at the arrangement pitch P2.

The B1micro LED, the B3micro LED, and the B5micro LED may be arranged between the A5micro LED, the A3micro LED, and the A1micro LED arranged first one the existing target substrate 30, respectively.

Accordingly, the A5micro LED, the B1micro LED, the A3micro LED, the B3micro LED, the A1micro LED, the B5micro LED may be mutually arranged at a first pitch P1 on the target substrate 30.

Further, the average value of the performance grade between the specific areas Q1 to Q3 of the target substrate 30 may be uniform, and the plurality of micro LEDs of mutually different performance grades may be uniformly dispersed and arranged.

In addition, the processor 60 may determine the moving order of each of the plurality of micro LEDs 21, and control the transfer device 10 to cause each of the plurality of micro LEDs to be arrnaged on the target substrate 30 based on the arrangement position and moving order of each of the determined plurality of micro LEDs 21.

Figure 5:
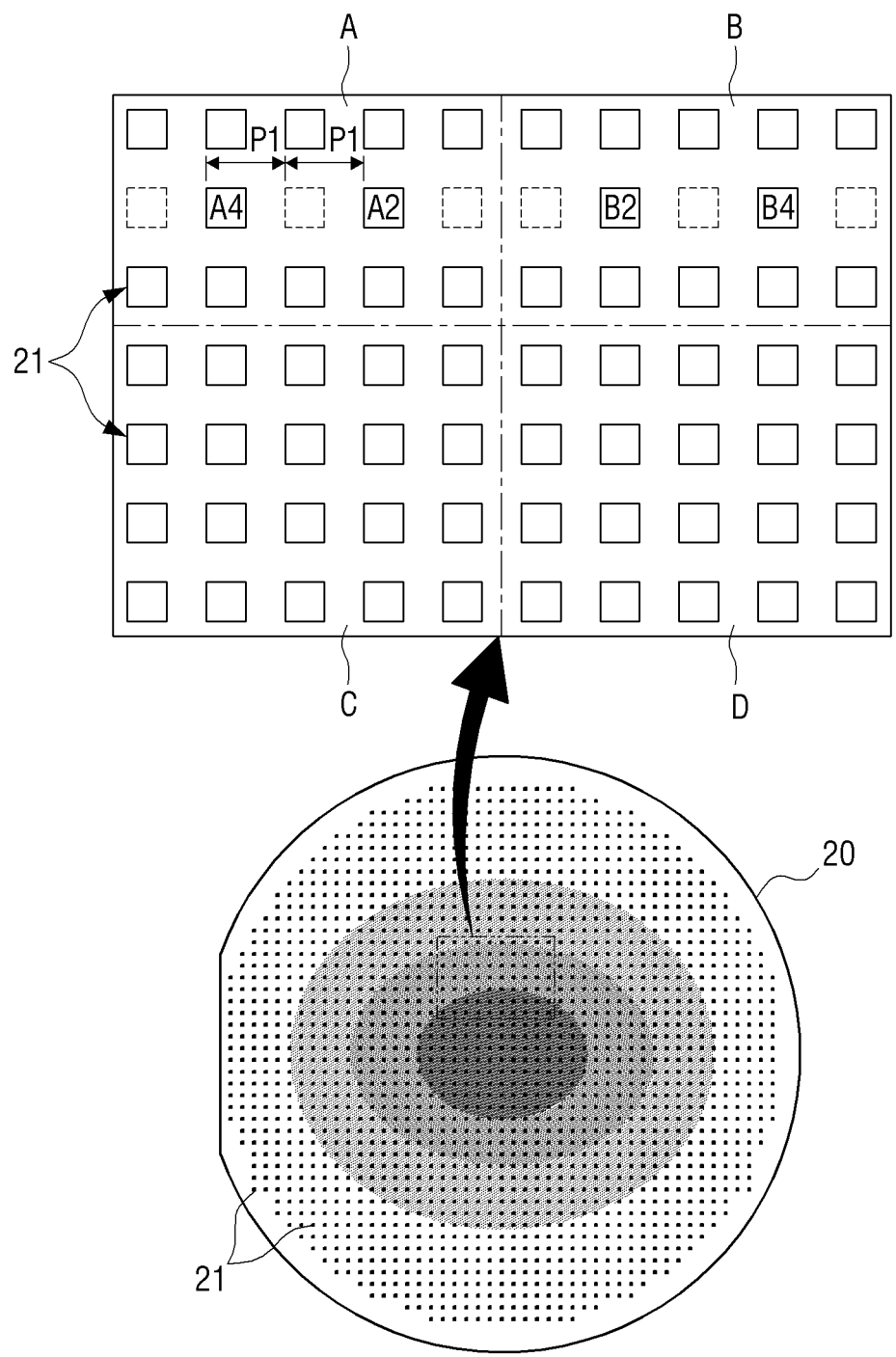
FIG. 5 is a top view of a transfer substrate after the process of FIGS. 4A and 4B.
Figure 6A:
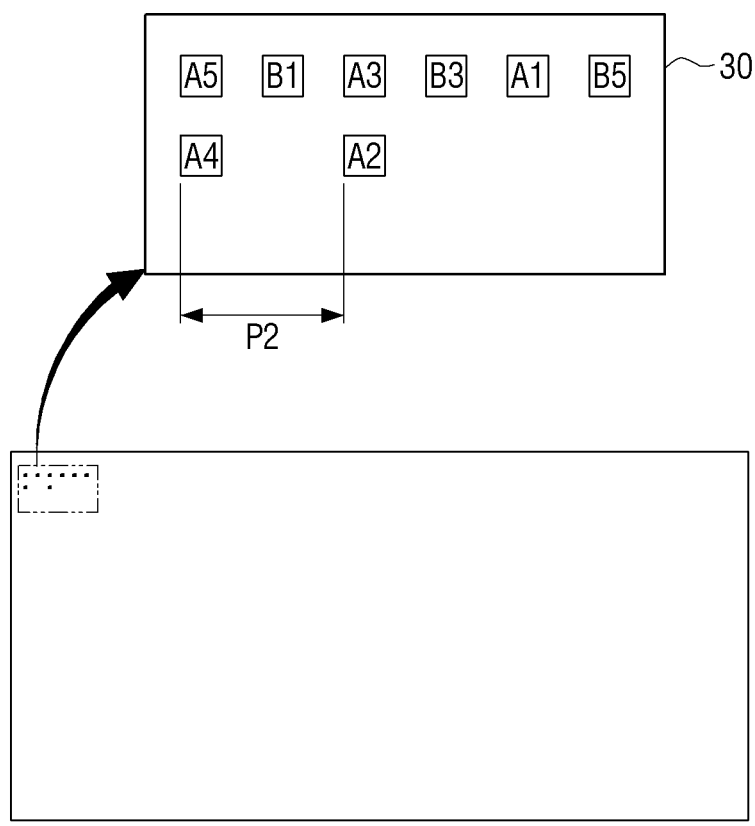
FIG. 6A is a top view illustrating a target substrate in a third state to which a plurality of micro LEDs after the process of FIG. 4B are mounted.
Figure 6B:
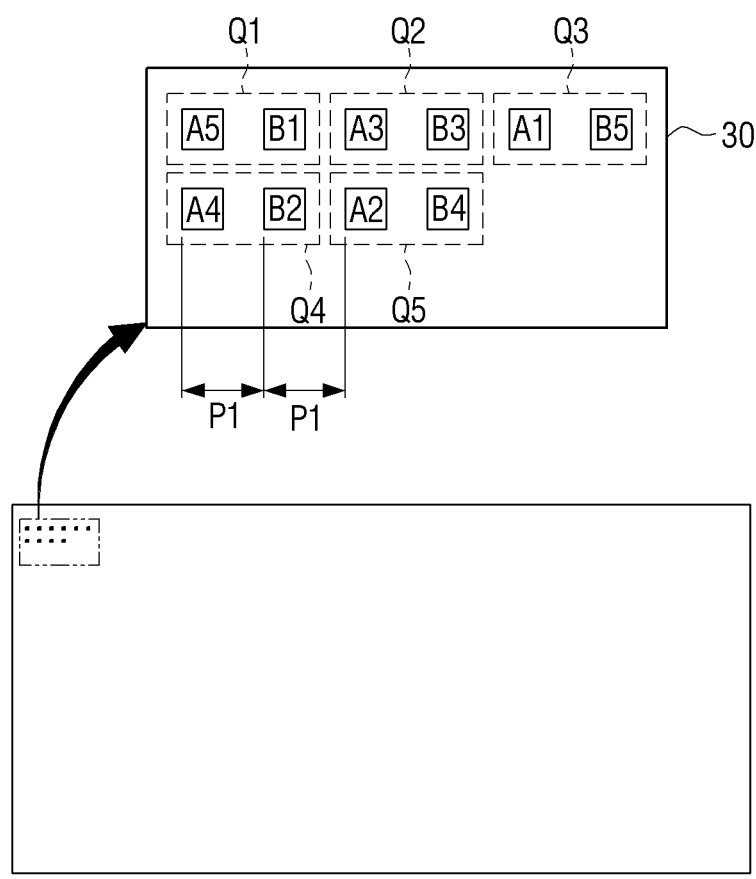
FIG. 6B is a top view illustrating a target substrate in a fourth state to which a plurality of micro LEDs are mounted.

FIG. 5 is a top view illustrating a transfer substrate 20 after the process in FIGS. 4A and 4B, FIG. 6A is a top view illustrating a target substrate 30 in a third state to which a plurality of micro LEDs 21 after the process of FIG. 4B are mounted, and FIG. 6B is a top view illustrating a target substrate 30 in a fourth state to which a plurality of micro LEDs 21 are mounted.

Further, based on the method being a pick and place method, the transfer substrate 20 in FIG. 5 may be a top view of the transfer substrate 20, and based on the method being a laser lift-off method, FIG. 5 may be a bottom view of the of the transfer substrate 20.

As illustrated in FIG. 5, after the A5micro LED, the B1micro LED, the A3micro LED, the B3micro LED, the A1micro LED, and the B5micro LED is picked up or separated from the transfer substrate 20, the remaining micro LEDs may be arranged on the transfer substrate 20.

In the A area of the transfer substrate 20, a A4micro LED, a A2micro LED may be arranged at an arrangement pitch P2 which is twofold of the first pitch P1, and in the B area, a B2micro LED and a B4micro LED may be arranged at an arrangement pitch P2 which is twofold of the first pitch P1.

The processor 60 may control the transfer device 10 to cause the A4micro LED and the A2micro LED to be simultaneously picked up at a predetermined arrangement pitch P2 or simultaneously separated from the transfer substrate 20, and to arrange the A4micro LED and the A2micro LED picked up or separated from the transfer substrate 20 at the arrangement position of the determined target substrate 30.

The arrangement position to which the A4micro LED and the A2micro LED are arranged on the target substrate 30 may be arranged at a different column or a different row from that of the area to which the previous A5micro LED, B1micro LED, A3micro LED, B3micro LED, A1micro LED, and B5micro LED are arranged.

Then, the processor 60 may be configured to control the transfer device 10 to simultaneously pick up the B2micro LED and the B4micro LED at a predetermined arrangement pitch P2 or simultaneously separate from the transfer substrate 20, and arrange the B2micro LED and the B4micro LED which may be picked up or separated from the transfer substrate 20 in-between the determined A4micro LED and the A2micro LED which were previously arranged.

Accordingly, the A4micro LED, the B2micro LED, the A2micro LED, and the B4micro LED may be mutually arranged on the target substrate 30 at a first pitch P1.

Further, the average value of the performance grade between the specific areas Q4 to Q5 on the target substrate 30 may be uniform, and the plurality of micro LEDs of mutually different performance grades may be evenly dispersed and arranged.

Figure 7:
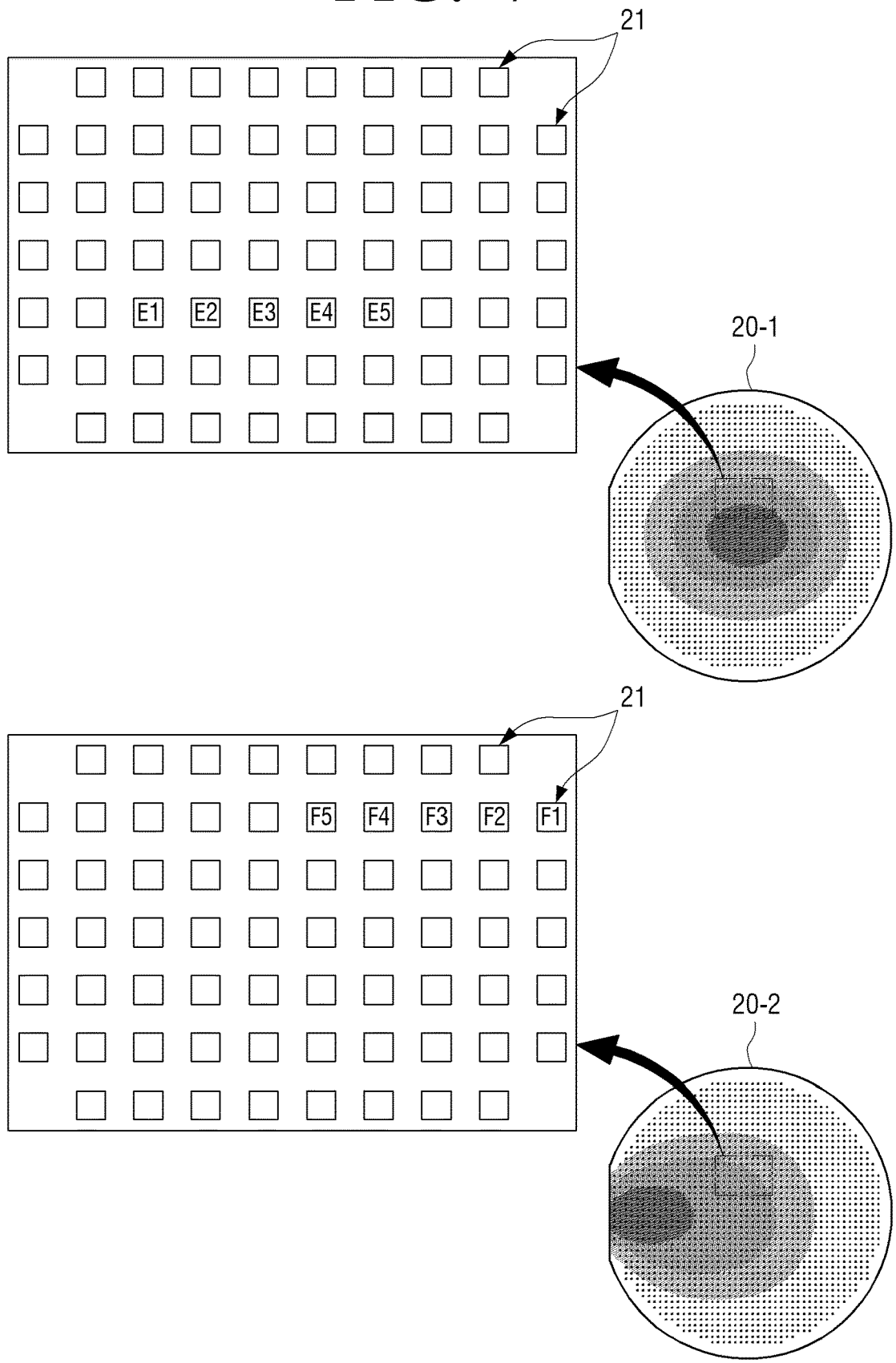
FIG. 7 is a top view illustrating a plurality of transfer substrates to which feature information of a plurality of micro LEDs are input according to another embodiment of the disclosure.
Figure 8A:
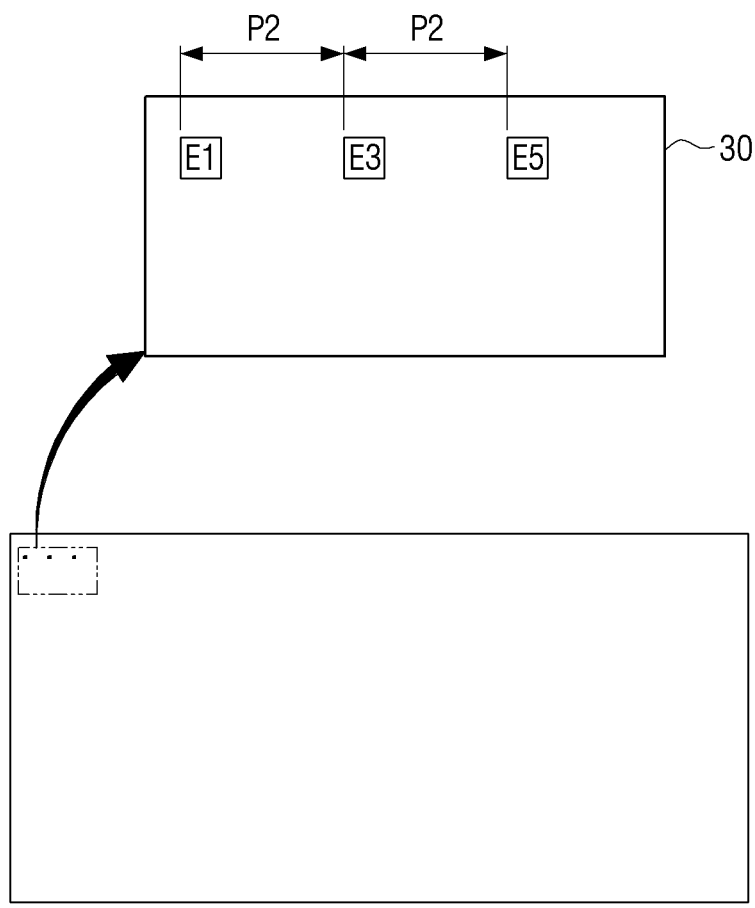
FIG. 8A is a top view illustrating a target substrate to which a plurality of micro LEDs from a plurality of substrates are mounted.
Figure 8B:
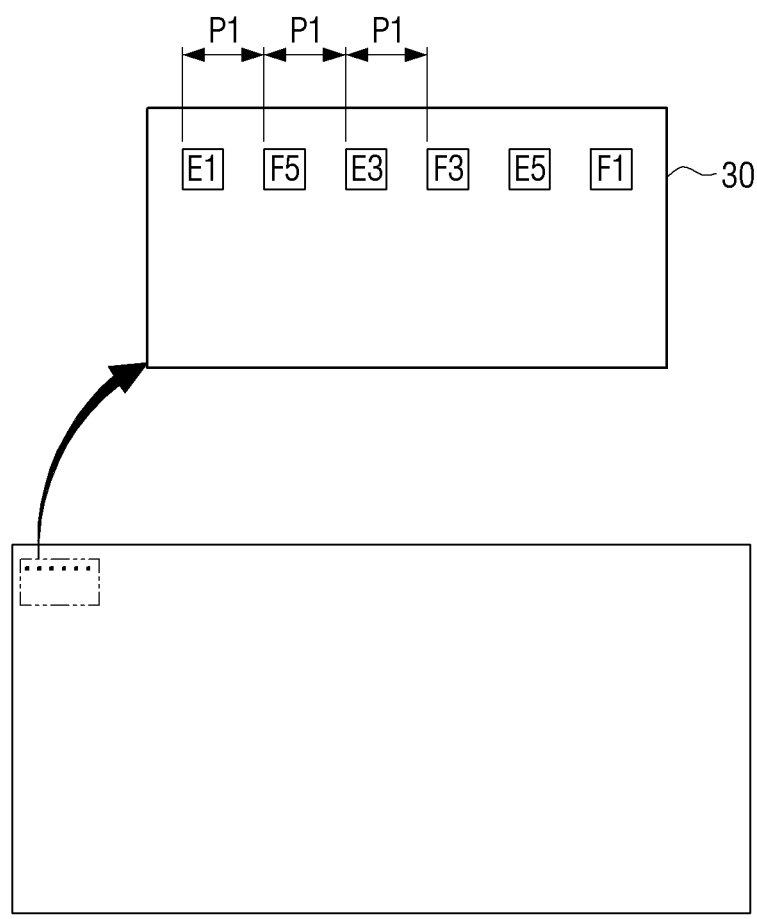
FIG. 8B is a top view illustrating a plurality of micro LEDs from the target substrate of FIG. 8A being additionally mounted.

FIG. 7 is a top view illustrating a plurality of transfer substrates 20-1 and 20-2 to which feature information of a plurality of micro LEDs 21 are input according to another embodiment of the disclosure, FIG. 8A is a top view illustrating a target substrate 30 to which a plurality of micro LEDs 21 from a plurality of transfer substrates 20-1 and 20-2 are mounted, and FIG. 8B is a top view illustrating a plurality of micro LEDs from the target substrate of FIG. 8A being additionally mounted.

Referring to FIG. 7, the plurality of micro LEDs with different features from one another may be arranged on the plurality of transfer substrates 20-1 and 20-2.

Because the storage 50, the processor 60, the feature information, and the arrangement pitch are the same as the previously described description, redundant description thereof will be omitted.

On a first transfer substrate 20-1, a E1 micro LED to E5 micro LEDs of different features may be arranged at a first pitch P1, and on a second transfer substrate 20-2, a F5 micro LED to F1 micro LED of different features may be arranged at a first pitch P1.

The plurality of micro LEDs arranged on the first to second transfer substrates 20-1 and 20-2 may measure the feature of the plurality of micro LEDs by using an external measurement device (not shown), and store the feature information including the feature on the measured each of the plurality of micro LEDs in the storage 50.

That is, the storage 50 may store feature information of each of the plurality of transfer substrates 20-1 and 20-2.

Alternatively, the feature information stored in the storage 50 may be information input through a separate input device (not shown) of feature information measured by using an external measurement device (not shown).

As illustrated in FIG. 7, the processor 60 may determine the arrangement position on the target substrate 30 with respect to the plurality of micro LEDs of each of the plurality of transfer substrates 20-1 and 20-2 based on the feature information of each of the stored plurality of transfer substrates 20-1 and 20-2.

The processor 60 may determine an arrangement pitch P2 between the plurality of micro LEDs to be simultaneously picked up, and cause the plurality of micro LEDs arranged on the each of the transfer substrates 20-1 and 20-2 to be simultaneously picked up based on the determined arrangement pitch P2.

The processor 60 may control the transfer device 10 to cause the E1 micro LED, the E3 micro LED, and the E5 micro LED simultaneously picked up from the first transfer substrate 20-1 at the arrangement pitch P2 to move onto the target substrate 30 and arrange so that the E1 micro LED, the E3 micro LED, and the E5 micro LED is arranged on the target substrate at an arrangement pitch P2.

Accordingly, as illustrated in FIG. 8A, the E1 micro LED, the E3 micro LED, and the E5 micro LED may be arranged on the target substrate 30 at the arrangement pitch P2.

The processor 60 may then control the transfer device 10 to cause the F5 micro LED, the F3 micro LED, the F1 micro LED which is simultaneously picked up from the second transfer substrate 20-2 at the arrangement pitch P2 or separated from the transfer substrate 20 to move to the target substrate 30 and be arranged on the target substrate 30 at the arrangement pitch P2.

The picked up F5 micro LED, F3 micro LED, and F1 micro LED may be arranged in-between the E1 micro LED, the E3 micro LED, and the E5 micro LED which is first arranged on the previous target substrate 30, respectively.

Accordingly, the E1micro LED, the F5 micro LED, the E3 micro LED, the F3 micro LED, the E5 micro LED, and the F1 micro LED may be mutually arranged on the target substrate 30 at the first pitch P1.

Further, the average value of the performance grade between the specific areas Q1 to Q3 on the target substrate 30 may be uniform, and the plurality of micro LEDs of mutually different performance grades may be evenly dispersed and arranged.

In addition, by rearranging the plurality of micro LEDs on the target substrate 30 according to the performances of the plurality of LEDs arranged on the plurality of transfer substrates 20-1 and 20-2, the diversity in rearrangement of the standard deviation of the performance grades of the micro LEDs included in the specific area of the target substrate 30 falling with a predetermined range may be increased.

Accordingly, the time it takes for the processor 60 to determine the arrangement position and the arrangement pitch P2 for arranging on the target substrate 30 may be reduced, and various rearrangements may be possible.

Further, the disclosure is not limited to the pick and place method, and may also be applied to the laser lift-off method.

Accordingly, as described above, the processor 60 may reduce the time taken in determining the arrangement position and arrangement pitch P2 for arranging on the target substrate 30, and various rearrangements may be possible.

FIG. 9A is a flowchart illustrating a control method of an electronic device according to an embodiment of the disclosure.

First, the feature information of each of the plurality of micro LEDs 21 arranged on the transfer substrate 20 may be stored in the storage 50 (S10).

Then, the processor 60 may determine at least one from among the arrangement position and the arrangement pitch P2 on the target substrate 30 of each of the plurality of micro LEDs 21 based on the feature information stored in the storage 50 (S20).

The processor 60 may, in the step determining the arrangement position and the arrangement pitch P2, perform a simulation for determining the arrangement position and the arrangement pitch P2.

The processor 60 may determine an arbitrary arrangement position and arrangement pitch P2 (S20-1). Then, the processor 60 may calculate the standard deviation or average value of the plurality of micro LEDs to be arranged in the specific area of the target substrate 30 according to the determined arbitrary arrangement position and arrangement pitch P2 (S20-2).

Then, the processor 60 may determine whether or not the calculated standard deviation or average value falls within the predetermined range set by the user (S20-3).

Based on the calculated standard deviation and the average value falling within the predetermined range set by the user, the process may proceed to step S30 along an R1 route.

Further, based on the calculated standard deviation and the average value exceeding the predetermined range set by the user, the processor 60 may, following a R2 route, determine at least one from among a new arrangement position and arrangement pitch P2' on the target substrate of each of the plurality of micro LEDs 21 based again on the feature information stored in the storage 50 (S20).

In addition, when the processor 60 determines a new arbitrary arrangement position and arrangement pitch P2', a determination may be made taking into reference the simulation result on the previously calculated arrangement position and arrangement pitch P2.

Then, the processor 60 may be configured to control the transfer device 10 to simultaneously pick up the plurality of micro LEDs at the determined arrangement pitch P2 (S30).

Then, the processor 60 may be configured to control the transfer device 10 to cause the plurality of micro LEDs picked up at the determined arrangement pitch P2 to be arranged at the determined arrangement position of the target substrate 30 (S40).

Further, the processor 60 may be configured to control the transfer device 10 to repeatedly execute steps S30 and S40 along a R3 route. Accordingly, the transfer device 10 may produce a light-emitting module of a display by rearranging the plurality of micro LEDs arranged on the transfer substrate 20 to the target substrate.

FIG. 9B is a flowchart illustrating a control method of an electronic device 1 according to another embodiment of the disclosure. Because, steps S10 and S20 of FIG. 10B are identical with steps S10 and S20 described above, redundant descriptions thereof will be omitted.

After proceeding with steps S10 to S20, the processor 60 may simultaneously separate the plurality of micro LEDs 21 from the transfer substrate 20 at a predetermined arrangement pitch P2.

By disposing the mask plate 22 formed with the through hole W on the transfer substrate 20 at a determined arrangement pitch P2 and irradiating a laser, the plurality of micro LEDs 21 may be simultaneously separated from the transfer substrate 20 at the determined arrangement pitch P2 (S30).

Then, the plurality of micro LEDs separated from the transfer substrate 20 may be mounted to the target substrate 30 which is disposed at the bottom surface of the transfer substrate 20 (S40).

Further, the processor 60 may be configured to control the transfer device 10 to repeatedly execute steps S30 and S40 along the R3 route.

Accordingly, the transfer device 10 may produce a light-emitting module of a display by rearranging the plurality of micro LEDs arranged on the transfer substrate 20 to the target substrate 30.

The method of arranging the micro LED 21 according to still another embodiment of the disclosure will be described below with reference to FIGS. 10 to 14.

Figure 10:
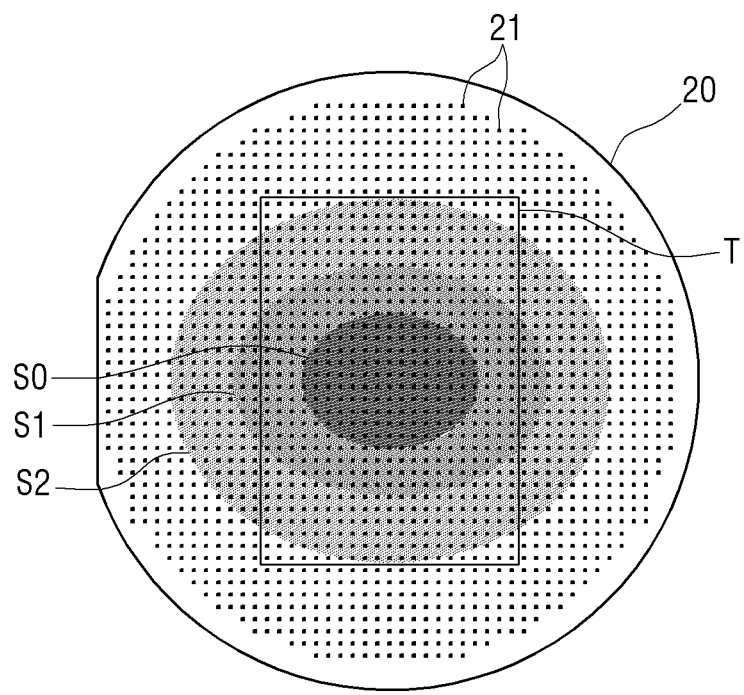
FIG. 10 is a top view illustrating a transfer substrate.
Figure 11A:
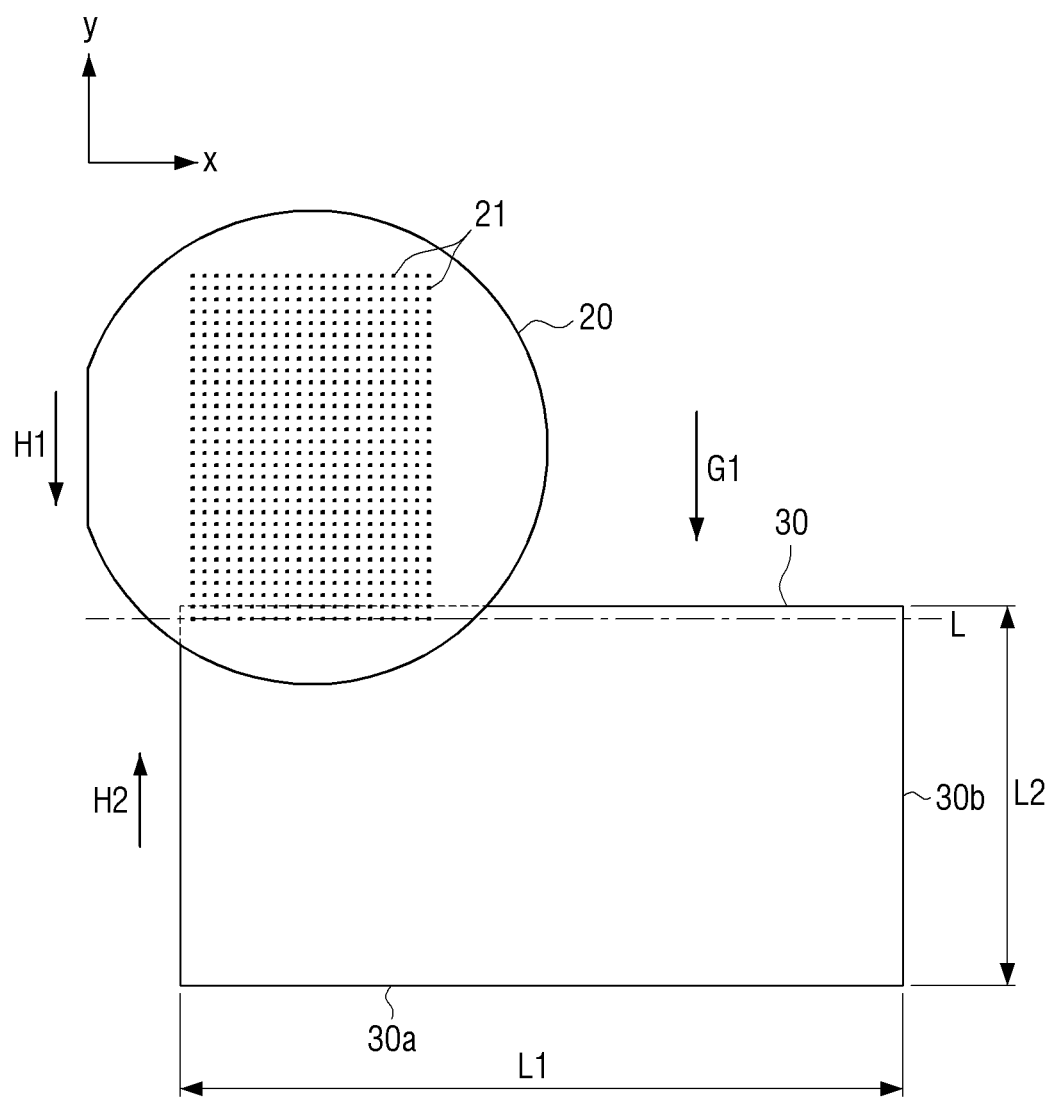
FIG. 11A is a schematic diagram illustrating a transfer substrate arranged on a target substrate according to still another embodiment of the disclosure.
Figure 11B:
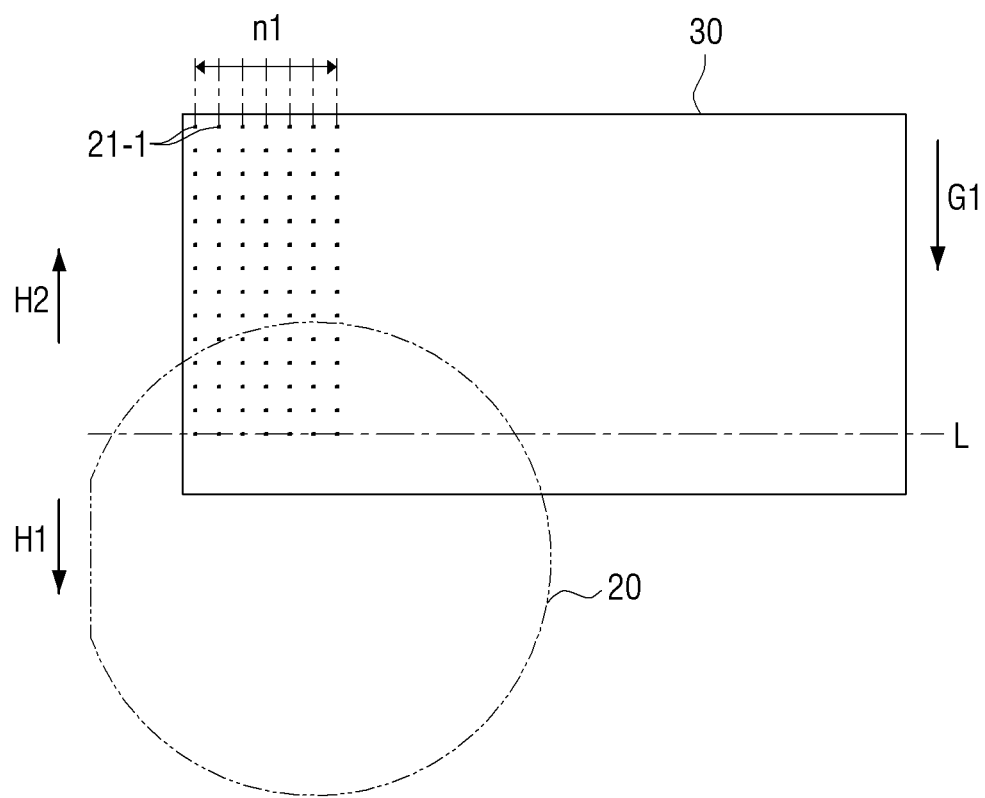
FIG. 11B is a schematic diagram illustrating a plurality of micro LEDs being transferred to a first plurality of columns in a first direction in a state illustrated in FIG. 11A.
Figure 11C:
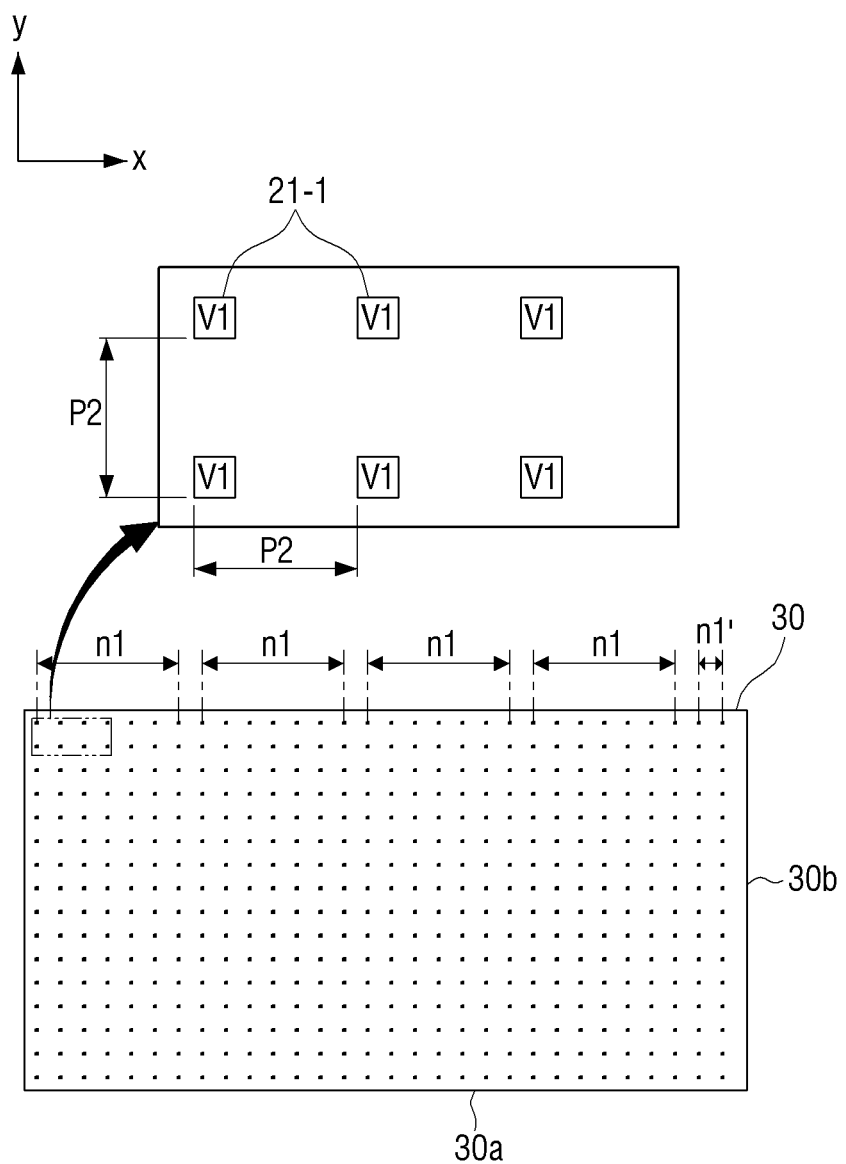
FIG. 11C is a top view illustrating a target substrate which a first plurality of columns are transferred in a first direction.
Figure 12A:
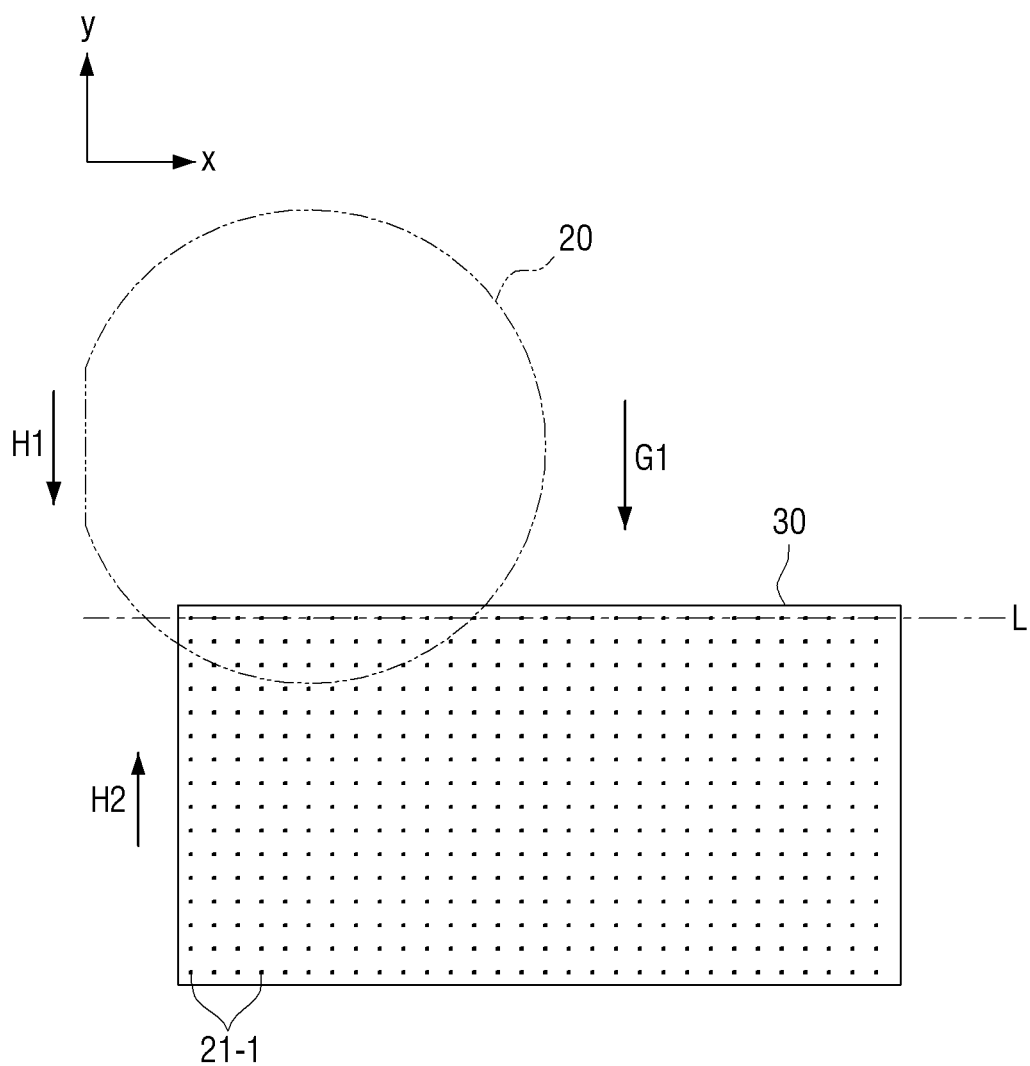
FIG. 12A is a schematic diagram illustrating a transfer substrate arranged on a target substrate in a state illustrated in FIG. 11C.
Figure 12B:
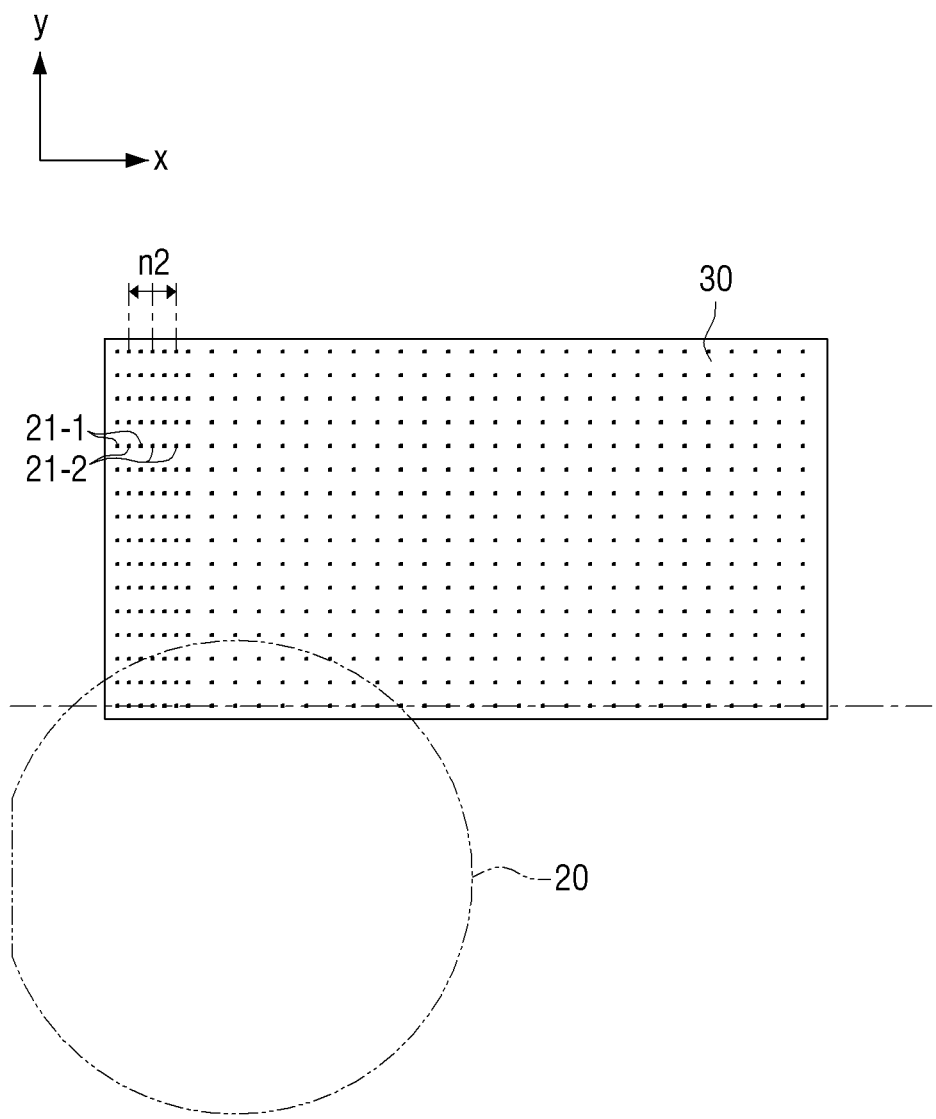
FIG. 12B is a schematic diagram illustrating a plurality of micro LEDs being transferred to a second plurality of columns in a first direction in a state illustrated in FIG. 12A.
Figure 12C:
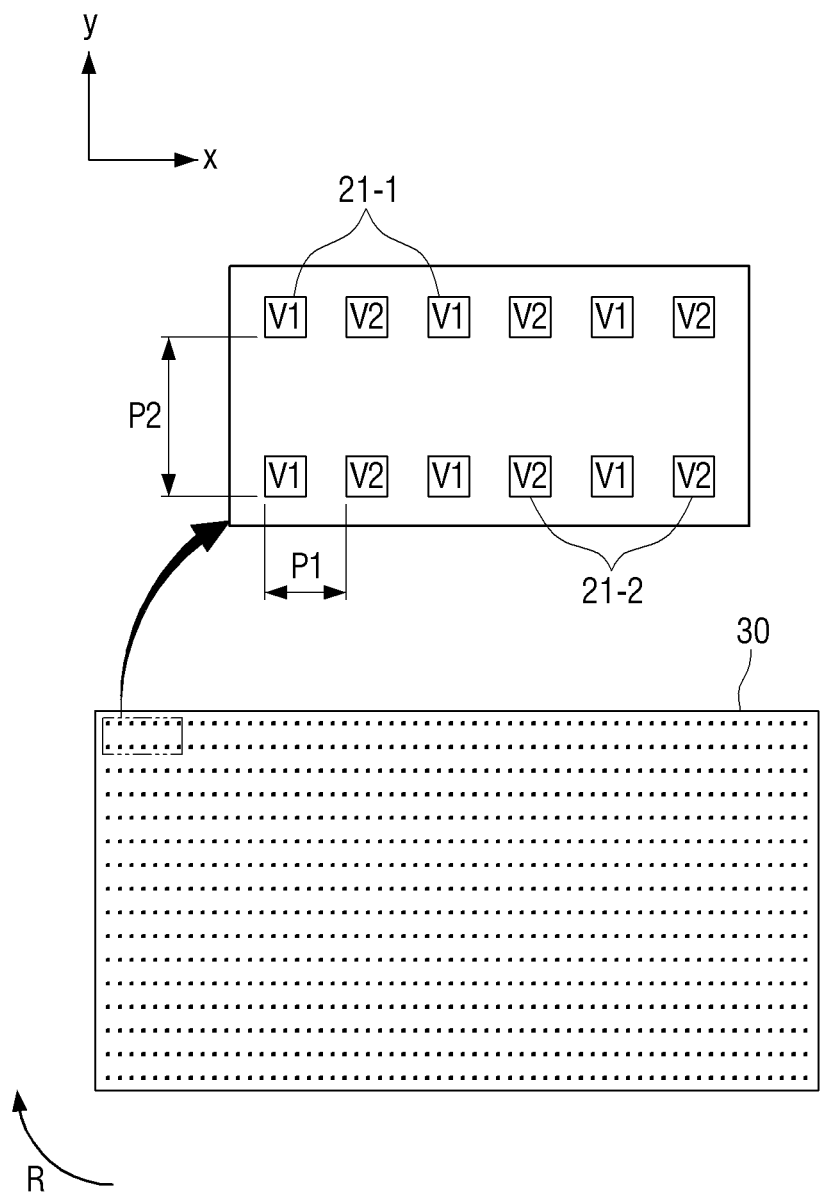
FIG. 12C is a top view illustrating a target substrate to which a second plurality of columns are transferred in a first direction.
Figure 13A:
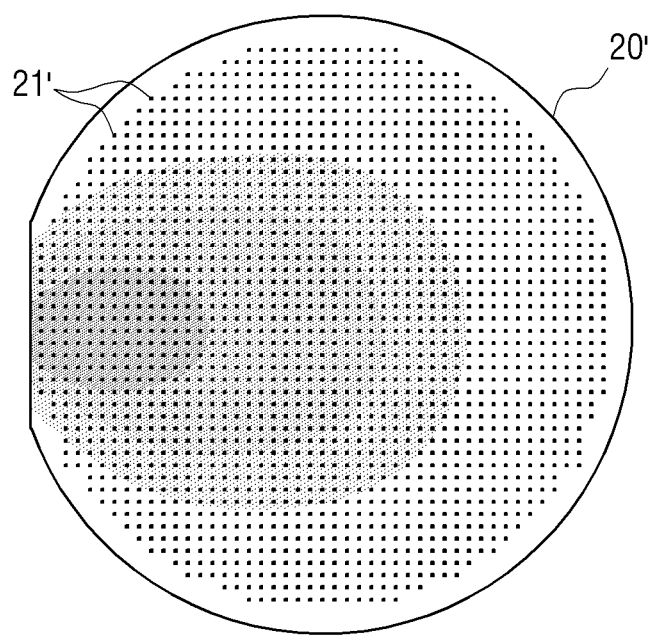
FIG. 13A is a schematic diagram illustrating another transfer substrate.
Figure 13B:
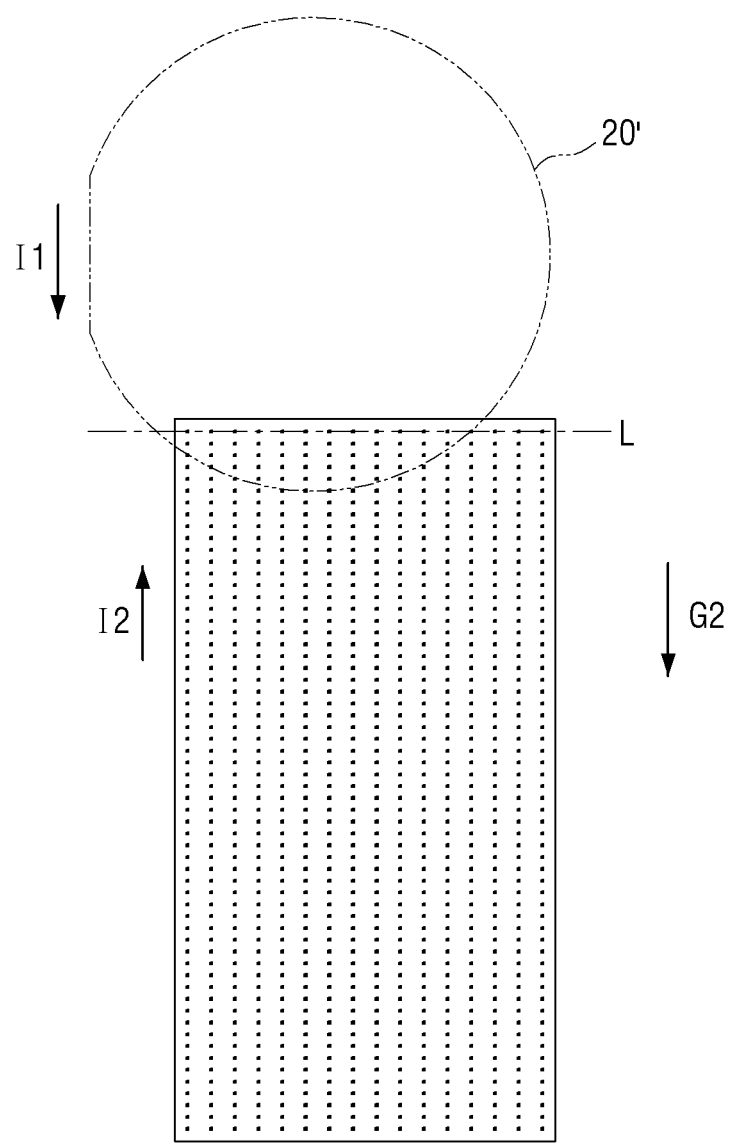
FIG. 13B is a schematic diagram illustrating a transfer substrate arranged on a target substrate in a rotated state.
Figure 13C:
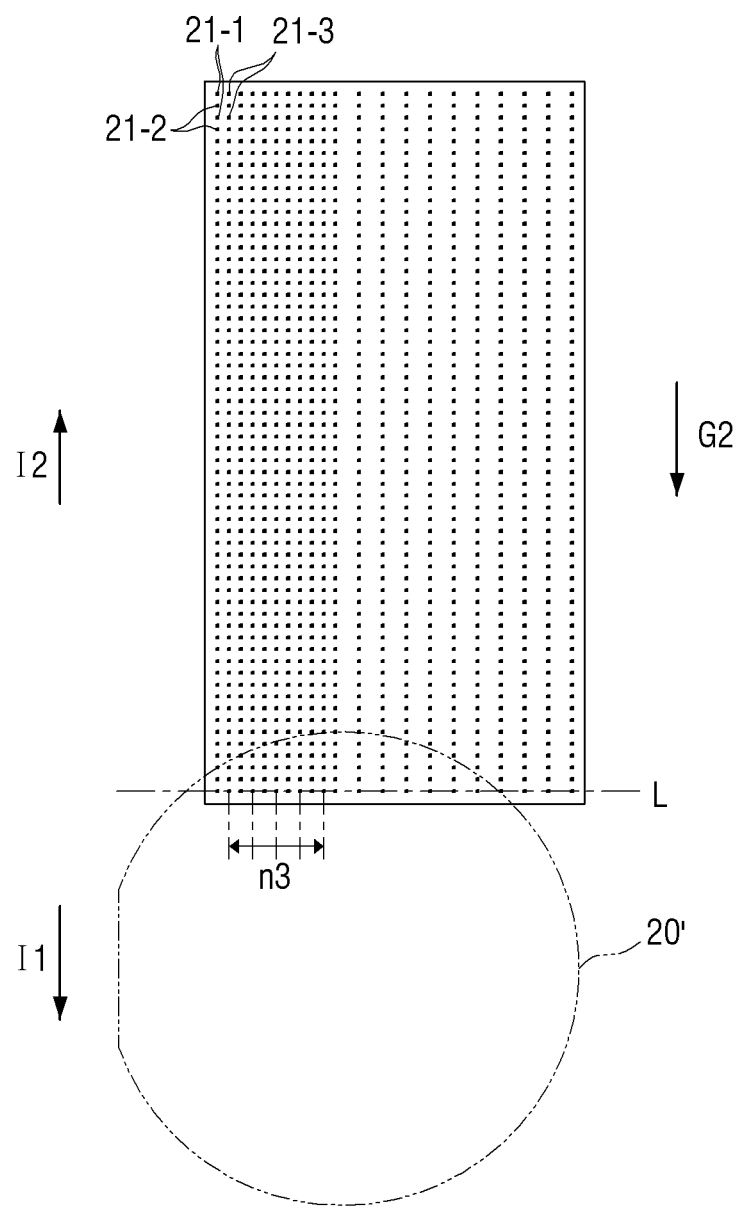
FIG. 13C is a schematic diagram illustrating a plurality of micro LEDs being transferred in a second direction in an state illustrated in FIG. 13B.
Figure 14:
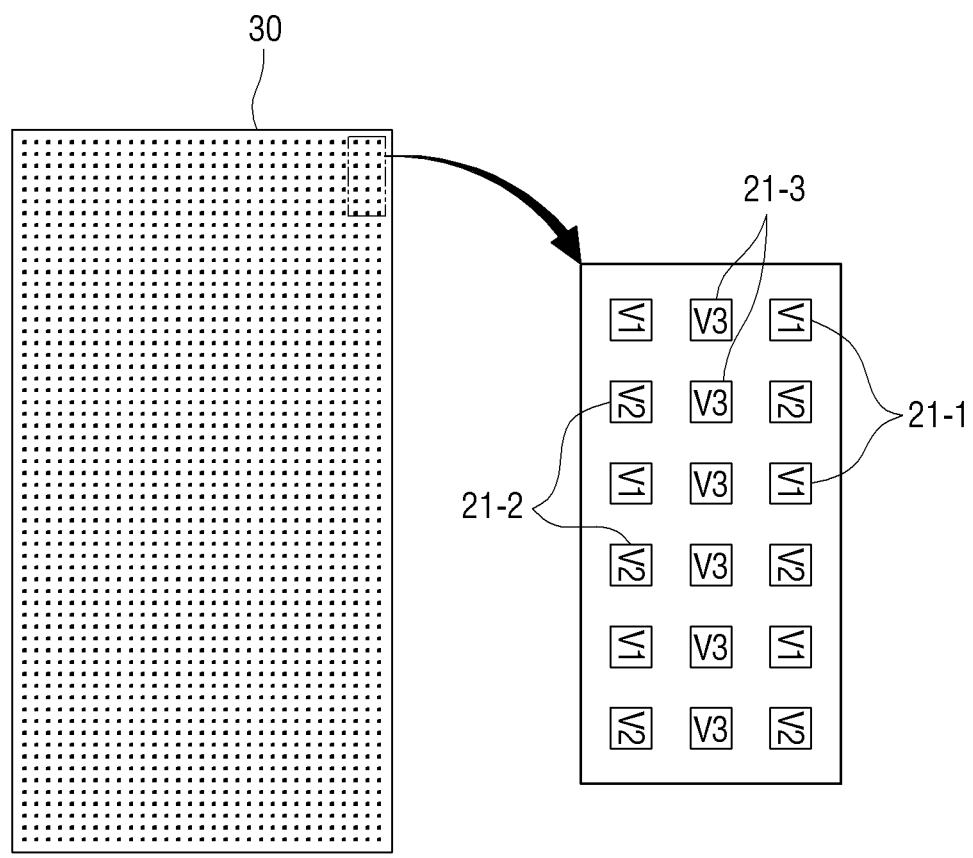
FIG. 14 is a top view illustrating a target substrate in a state in which a transfer process is completed according to still another embodiment of the disclosure.

FIG. 10 is a top view illustrating a transfer substrate 20, FIG. 11A is a schematic diagram illustrating a transfer substrate 20 arranged on a target substrate 30 according to still another embodiment of the disclosure, FIG. 11B is a schematic diagram illustrating a plurality of micro LEDs 21 being transferred to a first plurality of columns in a first direction G1 in a state illustrated in FIG. 11A, FIG. 11C is a top view illustrating a target substrate 30 which a first plurality of columns n1 are transferred in a first direction, FIG. 12A is a schematic diagram illustrating a transfer substrate 20 arranged on a target substrate 30 in a state illustrated in FIG. 11C, FIG. 12B is a schematic diagram illustrating a plurality of micro LEDs 21 being transferred to a second plurality of columns n2 in a first direction G1 in a state illustrated in FIG. 12A, FIG. 12C is a top view illustrating a target substrate 30 to which a second plurality of columns n2 are transferred in a first direction G1, FIG. 13A is a schematic diagram illustrating another transfer substrate 20', FIG. 13B is a schematic diagram illustrating a transfer substrate 20 arranged on a target substrate 30 in a rotated state, FIG. 13C is a schematic diagram illustrating a plurality of micro LEDs 21 being transferred in a second direction G2 in an state illustrated in FIG. 13B, and FIG. 14 is a top view illustrating a target substrate 30 in a state in which a transfer process is completed according to still another embodiment of the disclosure.

Like reference numerals have been used for like configurations, and redundant descriptions thereof will be omitted. For example, the plurality of micro LEDs 21, the transfer substrate 20, the target substrate 30, the storage 50, and the processor 60 may be the same as described above.

The electronic device 1 may transfer the plurality of micro LEDs 21 arranged on the transfer substrate 20 onto the target substrate 30 by using feature information stored in the storage 50.

For example, as illustrated in FIG. 10, the plurality of micro LEDs 21 on the transfer substrate 20 may have different features from one another in the first to third feature areas S0 to S2.

The processor 60 may determine a transfer area T on the transfer substrate 20 based on the feature information of the plurality of micro LEDs 21 stored in the storage 50.

The transfer area T may be an arbitrary area of the transfer substrate 20 which includes the plurality of micro LEDs 21 to be transferred on the target substrate 30.

Further, the processor 60 may, based on the feature information of the plurality of micro LEDs 21, determine the transfer area T a the simulation result on the arrangement position of the plurality of micro LEDs 21 on the target substrate 30.

First, as illustrated in FIG. 11A, the electronic device 1 may arrange the transfer substrate 20 on the target substrate 30.

The plurality of micro LEDs 21 may be arranged at a first pitch P1 on the transfer substrate 20. Further, the plurality of micro LEDs 21 may include a first to third plurality of micro LEDs 21-1, 21-2, and 21-3.

The first plurality of micro LEDs 21-1 may refer to the plurality of micro LEDs transferred to a first plurality of columns n1 in the first direction G1, the second plurality of micro LEDs 21-2 may refer to the plurality of micro LEDs transferred to a second plurality of columns n2 in the first direction G1, and the third plurality of micro LEDs 21-3 may refer to the plurality of micro LEDs transferred in a second direction G2 perpendicular with the first direction G1.

The target substrate 30 may be of rectangular shape in which a first length L1 of a first side 30a is longer than a second length L2 of a second side 30b. However, the target substrate 30 is not limited to the rectangular shape, and may be of a square shape if necessary.

On the area in which the transfer substrate 20 and the target substrate 30 face each other, a laser line L may be fixedly disposed. The laser line L may refer to a line to which a laser is irradiated to transfer the plurality of micro LEDs 21 of the transfer substrate 20 on the target substrate 30 using a laser lift-off (LLO) method or a laser ablation method.

For example, as illustrated in FIG. 11A, the laser line L is fixed, and may move in a direction in which the transfer substrate 20 and the target substrate 30 are facing each other. Accordingly, the plurality of micro LEDs 21 of the transfer substrate 20 positioned on the laser line L may be transferred on the target substrate 30 positioned on the laser line L.

Further, for convenience of description, the laser line L has been illustrated as extended along the first side 30a, but the laser line L may be irradiated to a required width. In addition, the laser line L is not limited to a fixed state, but may be moved onto the transfer substrate 20 and the target substrate 30 if necessary.

Next, as illustrated in FIG. 11B, the electronic device 1 may move the transfer substrate 20 in a H1 direction parallel to the first direction G1 with respect to the laser line L, and move the target substrate 30 in a H2 direction parallel to the first direction G1 to transfer the plurality of micro LEDs 21*l*.

The H1 direction and H2 direction may be directions opposite to each other.

The processor 60 may transfer the plurality of micro LEDs 21 onto the target substrate 30 in the first direction G1. The first direction G1 may be designated as a horizontal direction, and may be in parallel with the Y-axis direction. Further, the first direction G1 may refer to a direction parallel with the second side 30b of the target substrate 30.

The processor 60 may transfer the plurality of micro LEDs 21 of the transfer substrate 20 to a first plurality of columns n1 with a second pitch P2 in the first direction G1 on the target substrate 30.

The first plurality of columns n1 may refer to an n1 number of columns arranged apart at a second pitch P2. Further, n1 may refer to a natural number. For example, as illustrated in FIG. 11B, based on n1 being 7, the plurality of micro LEDs of seven columns spaced apart at a second pitch P2 may be transferred through movement in the first direction G1.

In addition, the first pitch P1 and the second pitch P2 may be an integer multiple.

Further, the processor 60 may repeatedly transfer the plurality of micro LEDs 21 in the first direction G1 to the first plurality of columns n1 with a second pitch P2 on the target substrate 30.

Accordingly, as illustrated in FIG. 11C, the plurality of first micro LEDs 21-1 may be transferred on the target substrate 30 spaced apart at a second pitch P2. The plurality of micro LEDs may be transferred to the edge plurality of columns n1' of an edge area of the target substrate 30 which have different numbers of columns with the first plurality of columns n1.

Further, the first plurality of micro LEDs 21-1 may be transferred at a second pitch P2 horizontally and vertically. For example, the first plurality of micro LEDs 21-1 may be transferred at the second pitch P2 along the direction parallel with the second side 30b.

That is, through a repeated transfer in the first direction G1, the plurality of micro LEDs 21-1 may be arranged on the target substrate 30 at the second pitch P2.

Next, as illustrated in FIG. 12A, the processor 60 may arrange the transfer substrate 20 on the target substrate 30 to which the first plurality of micro LEDs 21-1 is arranged.

Then, as illustrated in FIG. 12B, the electronic device 1 may move the transfer substrate 20 in a H1 direction parallel to the first direction G1 with respect to the laser line L, and move the target substrate 30 in a H2 direction parallel to the first direction G2 to transfer the second plurality of micro LEDs 21-2.

The processor 60 may transfer the plurality of micro LEDs 21 of the transfer substrate 20 to a plurality of second columns n2 different from the first plurality of columns n1 in the first direction G1 on the target substrate 30 in-between the first plurality of micro LEDs 21-1 transferred to the first plurality of columns n1.

In addition, the second plurality of micro LEDs 21-1 may be transferred at the second pitch P2 horizontally and vertically. For example, the second plurality of micro LEDs 21-2 may be transferred at the second pitch P2 along the direction parallel with the second side 30b.

The second plurality of columns n2 may refer to columns of n2 number arranged at the second pitch P2. Further, n2 may refer to a natural number. Further, the number of second plurality of columns n2 may be smaller than a number of the first plurality of columns n1.

For example, based on the first plurality of columns n1 being 7 and the first plurality of micro LEDs 21-1 being arranged at the second pitch P2, and the second plurality of columns n2 being 3 and the second plurality of micro LEDs 21-2 being arranged at the second pitch P2 in-between the first plurality of micro LEDs 21-1, the first plurality of micro LEDs 21-1 may, through transferring once in the first direction G1, be arranged at a 1st, 3rd, 5th, 7th, 9th, 11th, and 13th columns in a direction parallel with the first side 30a, and the second plurality of micro LEDs 21-2 may be arranged at a 2nd, 4th, and 6th columns in a direction parallel with the first side 30a.

Accordingly, the second plurality of micro LEDs 21-2 which is to be transferred to the second plurality of columns n2 may be arranged in-between the first plurality of micro LEDs 21-1 which is transferred to the first plurality of columns n1.

That is, the first plurality of micro LEDs 21-1 and the second plurality of micro LEDs 21-2 may be mutually arranged at the first pitch P1 in the direction parallel to the first side 30a.

Further, the processor 60 may repeatedly transfer the plurality of micro LEDs 21 of the transfer substrate 20 in the first direction G1 to the second plurality of columns n2 at the second pitch P2 on the target substrate 30.

Accordingly, as illustrated in FIG. 12C, the first plurality of micro LEDs 21-1 and the second plurality of micro LEDs 21-2 may be arranged spaced apart at a first pitch P1 along the horizontal direction (X-axis direction) on the target substrate 30.

Accordingly, even if there is a difference in feature area on the transfer substrate 20 illustrated in FIG. 10, by dispersing and arranging the plurality of micro LEDs 21 of the transfer substrate 20 to the first plurality of micro LEDs 21-1 of the first plurality of columns n1 and the second plurality of micro LEDs 21-2 of the second plurality of columns n2, the feature area may be evenly dispersed and arranged.

Accordingly, the color and uniformity in brightness of the plurality of micro LEDS arranged on the target substrate 30 may be improved.

Further, n2 may not be a divisor of n1. That is, n1 may not be a multiple of n2. For example, if n1 is 8 and n2 is 4, n2 may, as a divisor of n1, be such that a pattern between the plurality of columns is repeated. Accordingly, the user may recognize the brightness of the micro LED of a constant period due to the repeated pattern, which may be an element causing the user to impede the uniformity of the brightness on the target substrate 30.

Accordingly, because n2 is not the divisor of n1, the repeated pattern of numerous numbers may be prevented, and the color and uniformity in brightness of the plurality of micro LEDs arranged on the target substrate 30 may be improved.

Next, as illustrated in FIG. 13B, after transferring the plurality of first micro LEDs 21-1 and the plurality of second micro LEDs 21-2 in the first direction G1, the target substrate 30 to which the first plurality of micro LEDs 21-1 and the second plurality of micro LEDs 21-2 are arranged may be rotated in a predetermined direction R.

The target substrate 30 may not be limited to rotating in the predetermined direction R, and may rotate at least one from among the target substrate 20 and the target substrate 30.

Further, as illustrated in FIG. 13A, a transfer substrate 20' other than the transfer substrate 20 transferred to the first direction G1 may be used. For example, another transfer substrate 20' may be used to transfer the plurality of micro LEDs in the second direction G2. However, the embodiment is not limited thereto, and the transfer substrate 20 used in the transfer in the first direction G1 may be used.

Next, as illustrated in FIGS. 13B and 13C, the electronic device 1 may move the transfer substrate 20' in a I1 direction parallel to the second direction G2 with respect to the laser line L, and move the target substrate 30 in a I2 direction parallel to the second direction G2 to transfer the plurality of micro LEDs 21.

The I1 direction and the I2 direction may be directions opposite to each other. Further, the second direction G2 may be a direction parallel with the first side 30a of the rotated target substrate 30.

The processor 60 may transfer the plurality of micro LEDs 21' of the other transfer substrate 20' to the second direction G2 which is perpendicular with the first direction G1 on the target substrate 30.

Further, the processor 60 may transfer a plurality of micro LEDs 21' of a different transfer substrate 20' between the plurality of micro LEDs 21-1 and 21-2 transferred in the first direction G1. In addition, the processor 60 may transfer the plurality of third micro LEDs 21-3 at the second pitch P2.

For example, as illustrated in FIG. 13C, the first plurality of micro LEDs 21-1 and the second plurality of micro LEDs 21-2 may be arranged spaced apart at the second pitch P2 in a direction parallel with the second side 30b, and the third plurality of micro LEDs 21-3 transferred in the second direction G2 may be transferred between the first plurality of micro LEDs 21-1 and between the second plurality of micro LEDs 21-23.

The third plurality of micro LEDs 21-3 may, as the plurality of third columns n3, be transferred on the target substrate 30 in the second direction G2. Here, n3 may be a natural number.

Accordingly, as illustrated in FIG. 14, the first to third plurality of micro LEDs 21-2, 21-2 and 21-3 transferred onto the target substrate 30 may be arranged at the first pitch P1 with one another.

However, as described above, even when transferring the third plurality of micro LEDs 21-3 in the second direction G2, the third plurality of micro LEDs 21-3 may be divided into a plurality of columns as with the first plurality of micro LEDs 21-1 and the second plurality of micro LEDs 21-2 and transferred in stages.

The processor 60 may use the feature information of the transfer substrate 20 and another transfer substrate 20', and determine the first to third plurality of micro LEDs 21-1, 21-2 and 21-3 to be transferred to the target substrate 30.

For example, the processor 60 may, through a simulation, determine the optimized first plurality of columns n1 and the second plurality of columns n2.

Accordingly, the plurality of LEDs 21 may realize a relatively uniform brightness and color, and may significantly reduce mura visibility of a display screen realized by the dispersed and arranged plurality of micro LEDs 21.

The method of arranging the micro LEDs 21 according to still another embodiment of the disclosure will be described below with reference to FIGS. 15A to 17B.

Figure 15A:
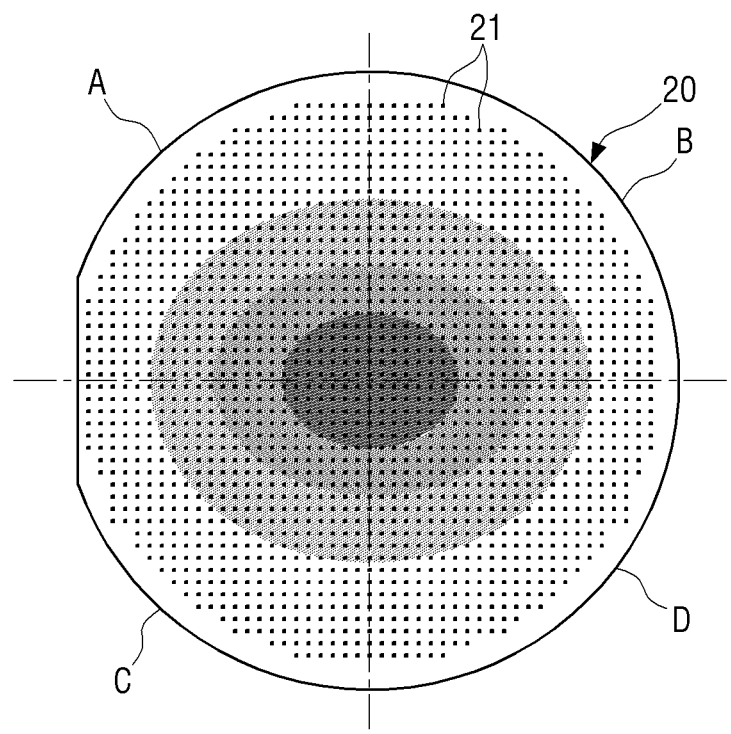
FIG. 15A is a top view illustrating a transfer substrate.
Figure 15B:
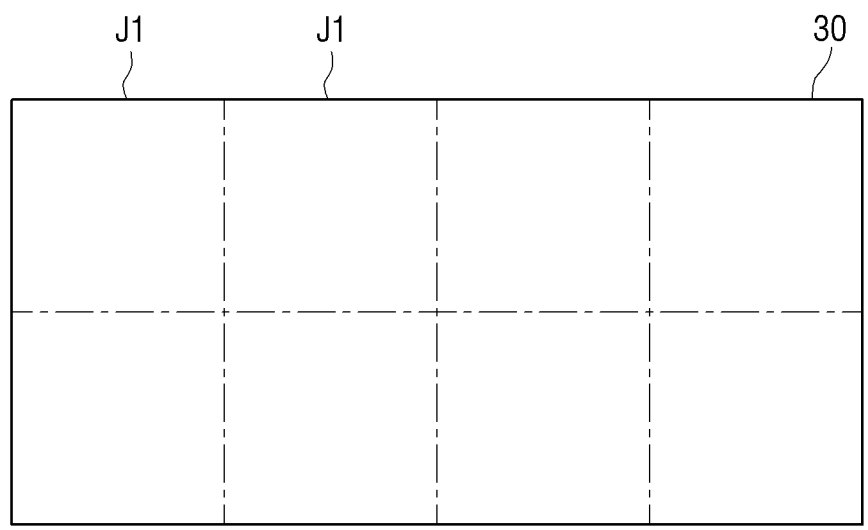
FIG. 15B is a schematic diagram illustrating a target substrate displayed with a plurality of first transfer areas according to still another embodiment of the disclosure.
Figure 15C:
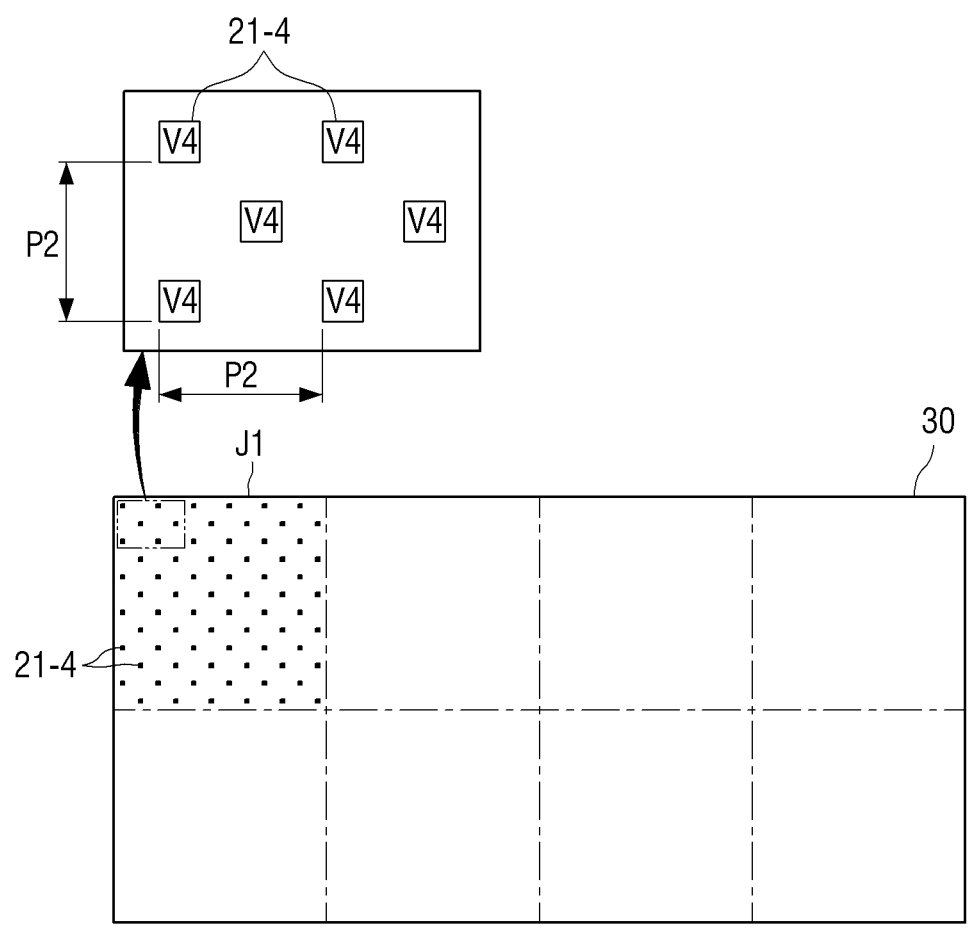
FIG. 15C is a top view illustrating a target substrate in a partially transferred state to a first transfer area.
Figure 16A:
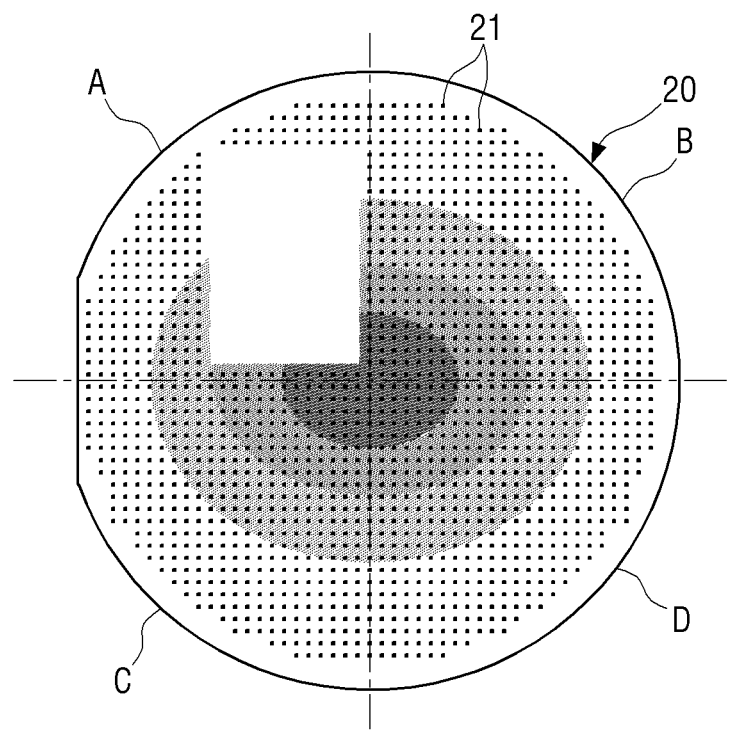
FIG. 16A is a top view illustrating a transfer substrate after being transferred to a first transfer area.
Figure 16B:
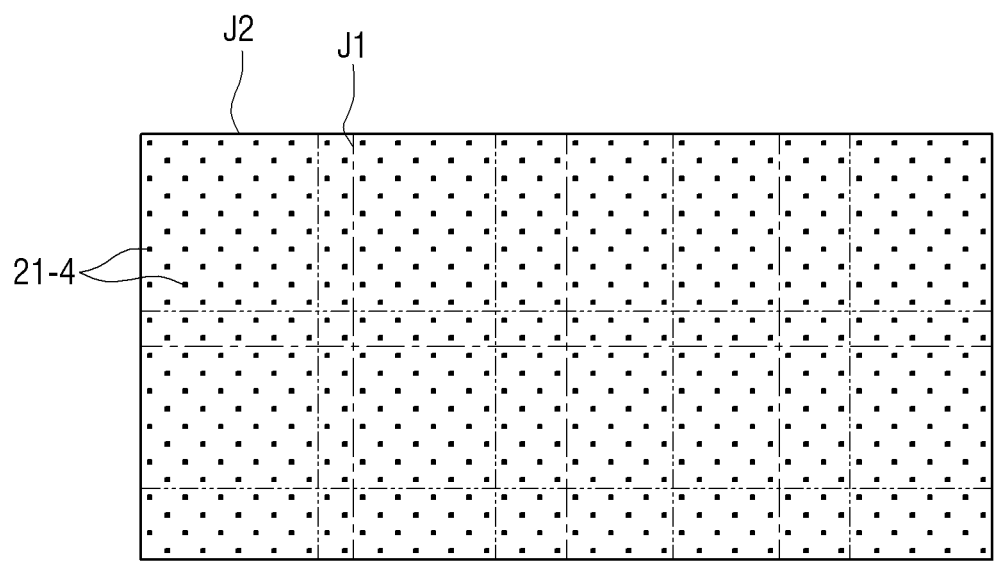
FIG. 16B is a schematic diagram illustrating a target substrate to which a plurality of second transfer area is displayed on a target substrate after being transferred to a first transfer area.
Figure 16C:
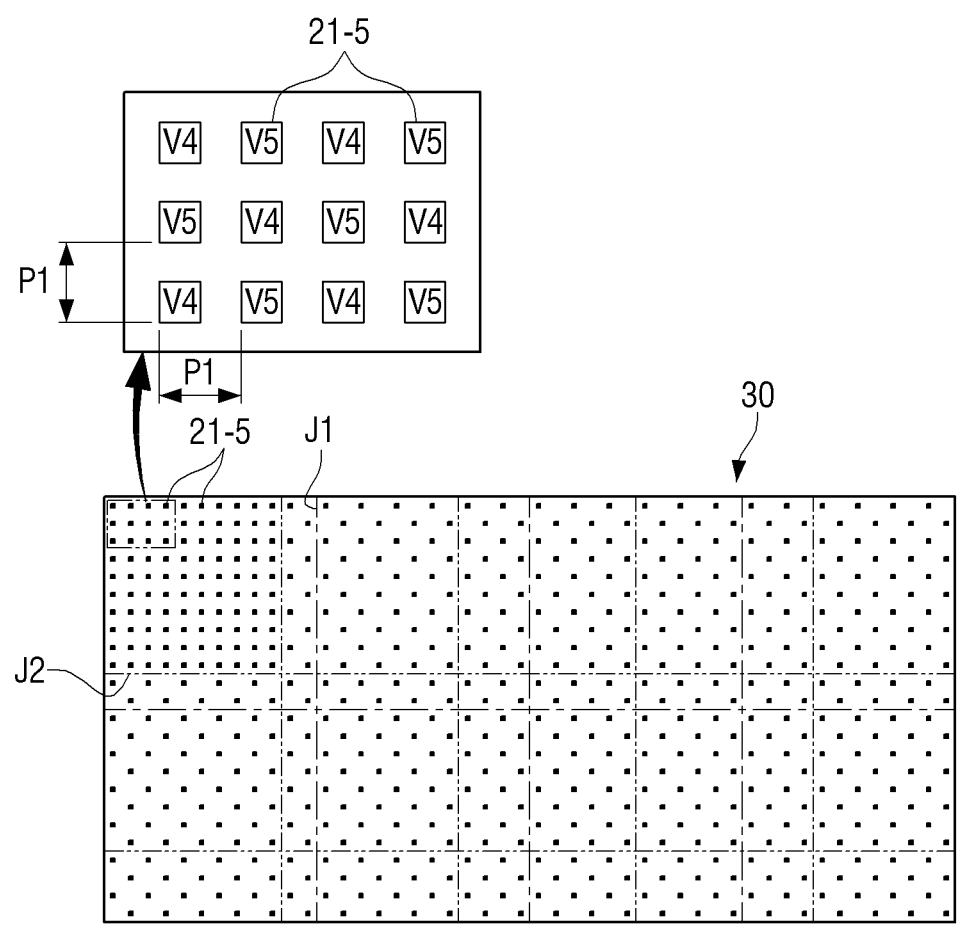
FIG. 16C is a top view illustrating a target substrate in a partially transferred state to a second transfer area.
Figure 17A:
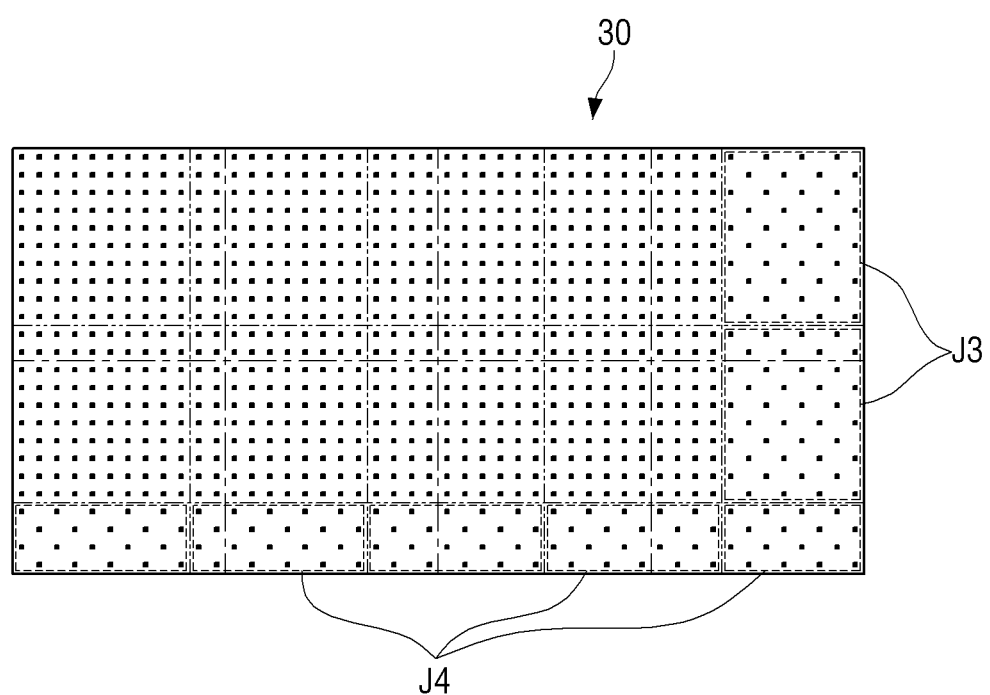
FIG. 17A is a top view illustrating a target substrate in a process of transferring to a second transfer area.
Figure 17B:
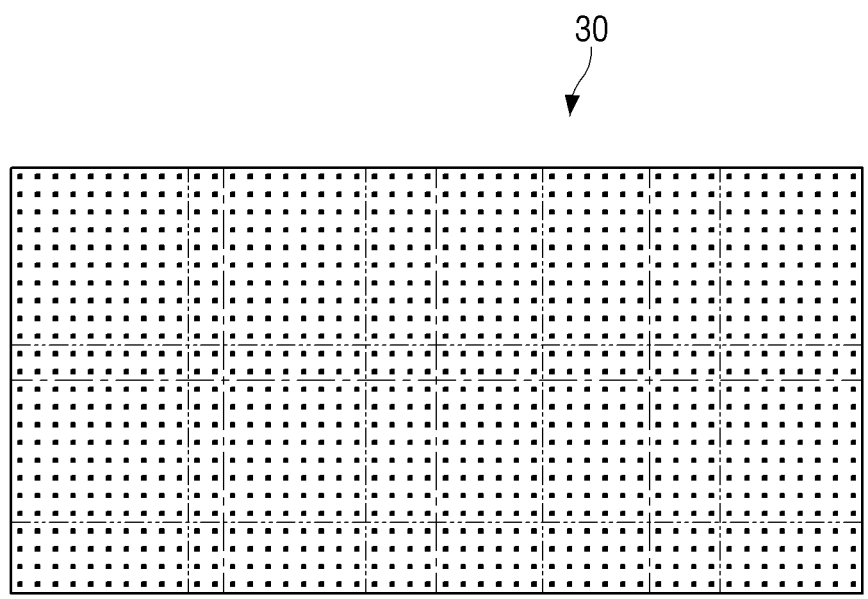
FIG. 17B is a top view illustrating a target substrate in a state in which a transfer process is complete according to still another embodiment of the disclosure.

FIG. 15A is a top view illustrating a transfer substrate 20, FIG. 15B is a schematic diagram illustrating a target substrate 30 displayed with a plurality of first transfer areas J1 according to still another embodiment of the disclosure, FIG. 15C is a top view illustrating a target substrate 30 in a partially transferred state to a first transfer area J1, FIG. 16A is a top view illustrating a transfer substrate 20 after being transferred to a first transfer area J1, FIG. 16B is a schematic diagram illustrating a target substrate 30 to which a plurality of second transfer area J2 is displayed on a target substrate 30 after being transferred to a first transfer area J1, FIG. 16C is a top view illustrating a target substrate 30 in a partially transferred state to a second transfer area J2, FIG. 17A is a top view illustrating a target substrate in a process of transferring to a second transfer area J2, and FIG. 17B is a top view illustrating a target substrate 30 in a state in which a transfer process is complete according to still another embodiment of the disclosure.

Like reference numerals have been used for like configurations, and redundant descriptions thereof will be omitted. For example, the plurality of micro LEDs 21, the transfer substrate 20, the target substrate 30, the storage 50, and the processor 60 may be the same as described above.

As illustrated in FIG. 15A, the transfer substrate 20 may represent an area with different features from one another due to the manufacturing tolerance, and the processor 60 may divide the transfer substrate 20 to a plurality of areas A, B, C and D.

Further, the electronic device 1 may use the feature information stored in the storage 50 to transfer the plurality of micro LEDs arranged on the transfer substrate 20 onto the target substrate 30.

Specifically, as illustrated in FIG. 15B, the processor 60 may, taking into consideration the size of the target substrate 30, divide the target substrate 30 into a plurality of first transfer areas J1.

For example, the processor 60 may transfer the plurality of fourth micro LEDs 21-4 to the first transfer area J1, and transfer the plurality of fifth micro LEDs 21-5 to a second transfer area J2 different from the first transfer area J1.

The processor 60 may, taking into consideration mura dispersion value of the target substrate 30 and the transfer time taken due to transferring the plurality of micro LEDs 21 all at once to the transfer area based on the feature information of the plurality of micro LEDs 21 of the transfer substrate 30, determine the transfer areas J1 and J2 on the target substrate 30.

The mura dispersion value may refer to the distribution of feature information of the plurality of micro LEDs 21 when the plurality of micro LEDs 21 with different feature information from one another are arranged on the target substrate 30.

For example, the smaller the transfer area is for transferring from the transfer substrate 20 to the target substrate 30, the mura dispersion value of the plurality of micro LEDs 21 on the transfer substrate 20 may increase on the target substrate 30. Accordingly, when the plurality of micro LEDs 21 on the target substrate 30 is operated, a uniform brightness on the target substrate 30 may be realized. However, the smaller the transfer area is for transferring from the transfer substrate 20 to the target substrate 30, the transfer time to the target substrate 30 may increase.

Accordingly, the processor 60 may, through a simulation taking into consideration the feature information, mura dispersion value, and the transfer time of the plurality of micro LEDs 21, determine an optimum transfer area.

First, as illustrated in FIG. 15C, the plurality of micro LEDs 21, which is the first transfer area J1 on the transfer substrate 20, may be transferred on the target substrate 30. That is, the plurality of micro LEDs 21 of the transfer substrate 20 may be transferred to the first transfer area J1 on the target substrate 30.

The plurality of micro LEDs 21 corresponding to the transfer area may be transferred on the target substrate 30 collectively in the pick and place method.

Accordingly, the plurality of micro LEDs 21 included within the first transfer area J1 may be repeatedly transferred to a position corresponding to the first transfer area J1 of the target substrate 30.

For example, because eight first transfer areas J1 are present on the target substrate 30, if the electronic device 1 transfers the plurality of micro LEDs 21 of the first transfer area J1 eight times, the plurality of first transfer area J1 of the target substrate 30 may be filled.

That is, the plurality of fourth micro LEDs 21-4 of the transfer substrate 20 may be collectively transferred on the target substrate 30 to the first transfer area J1. Further, as illustrated in FIG. 15C, the plurality of fourth micro LEDs 21-4 included within the first transfer area J1 may be transferred on the target substrate 30 spaced apart in the second pitch P2 in a horizontal and vertical direction.

That is, the plurality of fourth micro LEDs 21-4 arranged at odd columns and odd rows of the first transfer area J1 may be transferred on the target substrate 30.

The processor 60 may transfer the plurality of micro LEDs 21 arranged within the first area A of the transfer substrate 20 on the target substrate 30.

Next, as illustrated in FIGS. 16A to 16C, the processor 60 may transfer the plurality of micro LEDs arranged at the second pitch P2 within a second transfer area J2 different from the first transfer area J1 from among the plurality of micro LEDs 21 of the transfer substrate 20 to the second transfer area J2 on the target substrate 30.

The processor 60 may transfer the plurality of micro LEDs 21 within the second transfer area J2 in-between the plurality of micro LEDs 21 within the first transfer area J1.

For example, as illustrated in FIG. 16C, the plurality of fifth micro LEDs 21-5 of the second transfer area J2 may be transferred on the target substrate 30 to which the plurality of fourth micro LEDs 21-4 of the first transfer area J1 are transferred. The first transfer area J1 and the second transfer area J2 may overlap with each other on the target substrate 30.

Accordingly, the fifth plurality of micro LEDs 21-5 within the second transfer area J2 may be arranged in-between the plurality of fourth micro LEDs 21-4 in the second pitch P2.

Accordingly, the fourth plurality of micro LEDs 21-5 and the fifth plurality of micro LEDs 21-5 may be alternatively transferred and arranged at the first pitch P1 in a horiztonal and vertical direction.

Further, the second transfer area J2 may not be a divisor of the first transfer area J1. Based on the second transfer area J2 being a divisor of the first transfer area J1, a pattern between the plurality of columns may be repeated.

Accordingly, due to the repeated pattern, the user may recognize the brightness of the micro LEDs of a constant period, and this may be an element causing the user to impede the uniformity of the brightness on the target substrate 30.

Accordingly, because the second transfer area J2 is not a divisor of the first transfer area J1, the repeated pattern may be prevented and the color and the uniformity in brightness of the plurality of micro LEDs on the target substrate 30 may be improved.

The processor 60 may transfer, as the second transfer area J2, the plurality of micro LEDs 21 arranged within the second area D different from the first area A of the transfer substrate 20 on the target substrate 30.

Accordingly, because the first transfer area J1 is transferred from the first area A of the transfer substrate 20 and the second transfer area J2 is transferred from the second area D of the transfer substrate 20, a dispersion arrangement of a certain level or more of the plurality of micro LEDs 21 with different feature information may be possible.

Accordingly, the color and uniformity in brightness of the fourth and fifth plurality of micro LEDs 21-4 and 21-5 transferred on the target substrate 30 may be improved.

Then, referring to FIG. 17A, a third transfer area J2 and a fourth transfer area J4 of a size that does not correspond with the second transfer area J2 due to the size of the target substrate 30 may be included.

By transferring the plurality of micro LEDs 21 included within the second transfer area J2 to the third transfer area J3 and the fourth transfer area J4, the plurality of micro LEDs 21 may be transferred in the first pitch P1 as in FIG. 17B.

However, a plurality of micro LEDs that fit the third transfer area J3 and the fourth transfer area J4 may also be transferred, if necessary.

Accordingly, the electronic device 1 may, by repeatedly transferring through the transfer areas J1 and J2 of various sizes on the target substrate 30, transfer the plurality of micro LEDs with various feature information on the target substrate 30 by dispersion.

Accordingly, the plurality of micro LEDs 21 may realize a relatively uniform brightness and color, and mura visibility of the display screen realized by the dispersed and arranged plurality of micro LEDs 21 may be significantly reduced.

The above-described methods according to the various embodiments of the disclosure may be implemented in an application form installable in the electronic devices in the related art.

In addition, the above-described methods according to the various embodiments of the disclosure may be implemented as only a software upgrade or a hardware upgrade with respect to the electronic devices in the related art.

In addition, the above-described various embodiments may be performed through an embedded server provided in the electronic device, or an external server of the electronic device.

The various embodiments described above may be implemented in a recordable medium which is readable by computer or a device similar to computer using software, hardware, or the combination of software and hardware. In some cases, the embodiments described herein may be implemented by the processor 60 itself. According to a software implementation, embodiments such as the procedures and functions described herein may be implemented with separate software modules. Each of the software modules may perform one or more of the functions and operations described herein.

According to the above-described various embodiments of the disclosure, the computer instructions for performing a processing operation of the electronic device 1 may be stored in a non-transitory computer-readable medium. The computer instructions stored in the non-transitory computer-readable medium may, when executed by a processor of a specific device, have the specific device perform the processing operation of the electronic device 1 according to the above-described various embodiments.

The non-transitory computer readable medium refers to a medium that stores data semi-permanently rather than storing data for a very short time, such as a register, a cache, a memory or etc., and is readable by a device. Specific examples of the non-transitory computer readable medium may include, for example, and without limitation, a compact disc (CD), a digital versatile disc (DVD), a hard disc, a Blu-ray disc, a USB, a memory card, a ROM, and the like.

Although each of the various embodiments of the disclosure have been individually described, each embodiment may not necessarily be implemented on its own, and the configuration and operation of each embodiment may be combined and implemented with at least one other embodiment.

While the disclosure has been illustrated and described with reference to various embodiments thereof, the disclosure is not limited to the specific embodiments described, and it will be understood by those skilled in the art that various changes in form and details may be made therein without departing from the spirit and scope of the disclosure.

What is claimed is:

1. An electronic device, comprising:
   a transfer device configured to move a plurality of light-emitting diodes (LEDs) arranged on a transfer substrate to a target substrate and arrange the plurality of LEDs on the target substrate;
   a storage configured to store feature information about each of the plurality of LEDs; and
   a processor configured to:
      determine a target pitch and a target arrangement position for transferring the plurality of LEDs to the target substrate,
      determine a value of an output feature of the target substrate corresponding to an area from among a plurality of areas included in the target substrate based on the target pitch, the target arrangement position, and the feature information, and
      based on determining that the value of the output feature is within a predetermined range, control the transfer device to arrange the plurality of LEDs on the target substrate based on the target pitch and the target arrangement position.

2. The electronic device of claim 1, wherein the processor is further configured to:
   determine the target arrangement position such that a plurality of output features of the plurality of areas included in the target substrate are uniform; and
   arrange the plurality of LEDs in one area from among the plurality of areas included in the target substrate.

3. The electronic device of claim 2, wherein the processor is further configured to control the transfer device to alternatingly arrange the each of the plurality of LEDs in the one area of the target substrate.

4. The electronic device of claim 1, wherein the processor is further configured to control the transfer device to simultaneously pick up the plurality of LEDs mutually spaced apart on the transfer substrate.

5. The electronic device of claim 1, wherein the transfer device is configured to simultaneously pick up the plurality of LEDs on the transfer substrate and arrange the plurality of LEDs on the target substrate, and
   wherein the processor is further configured to control the transfer device to cause the plurality of LEDs to be simultaneously picked up based on the target pitch.

6. A method of arranging light emitting diodes (LEDs), the method comprising:
   dividing a transfer substrate arranged with a plurality of LEDs into a plurality of areas;
   determining a target pitch and a target arrangement position for transferring the each of the plurality of LEDs to a target substrate;
   determining a value of an output feature of the target substrate corresponding to an area from among the plurality of areas included in the target substrate based on the target pitch, the target arrangement position, and feature information about the plurality of LEDs; and
   based on the value of the output feature being within a predetermined range, arranging the plurality of LEDs on the target substrate based on the target pitch and the target arrangement position,
wherein after the arranging, a plurality of output features of the plurality of areas included in the target substrate are uniform, and LEDs from different areas from among the plurality of areas of the transfer substrate are arranged in one area of the target substrate.

7. The method of claim 6, wherein the arranging comprises alternatingly arranging the each of the plurality of LEDs of the transfer substrate in the one area of the target substrate.

8. The method of claim 6, wherein the arranging comprises simultaneously picking up the plurality of LEDs mutually spaced apart on the transfer substrate and arranging on the target substrate.

9. The method of claim 8, wherein the determining comprises determining a pitch of the plurality of LEDs to be simultaneously picked up, and
wherein the arranging comprises simultaneously picking up the plurality of LEDs based on the target pitch.

10. The method of claim 8, wherein the determining comprises determining the target arrangement position on the target substrate based on feature information about each of a plurality of transfer substrates.

11. The method of claim 8, wherein the determining comprises determining the target arrangement position on the target substrate based on the plurality of output features corresponding to the plurality of areas included in the target substrate and based on a moving distance of a transfer device of the target substrate.

12. The method of claim 6, wherein the arranging comprises:
transferring a first plurality of LEDs to a first plurality of columns at a pitch in a first direction on the target substrate;
transferring a second plurality of LEDs to a second plurality of columns different from the first plurality of columns in the first direction on the target substrate such that the second plurality of LEDs are between the first plurality of LEDs; and
transferring a third plurality of LEDs in a second direction perpendicular with the first direction on the target substrate, and
wherein the method further comprises rotating, after transferring the second plurality of LEDs, at least one from among the transfer substrate and the target substrate.

13. The method of claim 12, wherein the second plurality of LEDs are transferred at the pitch, and
wherein the third plurality of LEDs are transferred in the first direction.

14. The method of claim 6, wherein the arranging comprises:
transferring a first plurality of LEDs arranged at a pitch within a first transfer area of the transfer substrate to a first transfer area of the target substrate; and
transferring a second plurality of LEDs arranged at the pitch within a second transfer area of the transfer substrate different from the first transfer area to a second transfer area of the target substrate, and
wherein the transferring the second plurality of LEDs comprises transferring the second plurality of LEDs in-between the first plurality of LEDs.

15. The method of claim 14, wherein the first plurality of LEDs are arranged within a first area of the transfer substrate, and
wherein the second plurality of LEDs are arranged within a second area of the transfer substrate different from the first area.

16. The electronic device of claim 1, wherein the output feature comprises at least one from among an output wavelength, a brightness, and a performance grade of the plurality of LEDs, and
wherein the value of the output feature comprises at least one from among a standard deviation of the output feature and an average value of the output feature.

17. The electronic device of claim 1, wherein an average value of the output feature is uniform and based on the target pitch.

* * * * *